(12) United States Patent
Takiguchi et al.

(10) Patent No.: US 11,099,310 B2
(45) Date of Patent: Aug. 24, 2021

(54) IMAGE PICKUP DEVICE

(71) Applicant: SONY CORPORATION, Tokyo (JP)

(72) Inventors: Nozomi Takiguchi, Kanagawa (JP); Shinji Imaizumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 5 days.

(21) Appl. No.: 15/568,032

(22) PCT Filed: Apr. 5, 2016

(86) PCT No.: PCT/JP2016/001902
§ 371 (c)(1),
(2) Date: Oct. 20, 2017

(87) PCT Pub. No.: WO2016/189789
PCT Pub. Date: Dec. 1, 2016

(65) Prior Publication Data
US 2018/0114805 A1  Apr. 26, 2018

(30) Foreign Application Priority Data

May 27, 2015  (JP) .............................. JP2015-107387

(51) Int. Cl.
*H01L 27/146* (2006.01)
*G02B 5/20* (2006.01)
(Continued)

(52) U.S. Cl.
CPC ............. *G02B 5/208* (2013.01); *G02B 5/201* (2013.01); *G02B 5/223* (2013.01);
(Continued)

(58) Field of Classification Search
CPC ......... H01L 27/14627; H01L 27/14618; H01L 27/14621; H01L 27/1462; H01L 27/14645; G02B 5/223; G02B 5/208; G02B 5/201
See application file for complete search history.

(56) References Cited

U.S. PATENT DOCUMENTS 5,434,418 A * 7/1995 Schick ................... A61B 6/145
                                                            250/370.11
5,688,592 A * 11/1997 Shibahashi ............. B32B 27/18
                                                            428/323
(Continued)

FOREIGN PATENT DOCUMENTS

CN    103779368 A    5/2014
CN    203589032 U    5/2014
(Continued)

OTHER PUBLICATIONS

Rainer Ludwig and Liz Josephson, Clear Barriers and High Volume Productivity (Year: 2006).*
(Continued)

*Primary Examiner* — Shih Tsun A Chou
(74) *Attorney, Agent, or Firm* — Chip Law Group

(57) ABSTRACT

An image pickup device according to the present technology that includes an on-chip lens, a low-refractive index layer, and an infrared absorption layer. The on-chip lens is formed of a high-refractive index material. The low-refractive index layer is formed to be flat on the on-chip lens, the low-refractive index layer being formed of a low-refractive index material. The infrared absorption layer is formed of an infrared absorption material including at least one kind of organic infrared absorption dye and binder resin, a glass transition temperature of the binder resin being not less than 100° C., a concentration of the infrared absorption dye in the infrared absorption material being not less than 15 wt % and
(Continued)

not more than 50 wt %, the infrared absorption layer being laminated above the low-refractive index layer.

12 Claims, 18 Drawing Sheets

(51) Int. Cl.
*G02B 5/22* (2006.01)
*H04N 9/04* (2006.01)

(52) U.S. Cl.
CPC .... *H01L 27/1462* (2013.01); *H01L 27/14621* (2013.01); *H01L 27/14645* (2013.01); *H04N 9/045* (2013.01); *H01L 27/14618* (2013.01); *H01L 27/14627* (2013.01); *H01L 27/14685* (2013.01)

(56) References Cited

U.S. PATENT DOCUMENTS

| | | | | |
|---|---|---|---|---|
| 9,523,803 | B2* | 12/2016 | Iwasaki | G02B 5/22 |
| 9,991,304 | B2* | 6/2018 | Kimura | H01L 27/1462 |
| 2006/0159912 | A1* | 7/2006 | Haldeman | B32B 27/36 |
| | | | | 428/336 |
| 2008/0303107 | A1* | 12/2008 | Minamio | H01L 27/14627 |
| | | | | 257/432 |
| 2012/0068292 | A1* | 3/2012 | Ikeda | G02B 13/006 |
| | | | | 257/432 |
| 2015/0331163 | A1 | 11/2015 | Iwasaki et al. | |
| 2016/0091643 | A1* | 3/2016 | Arayama | H01L 31/02162 |
| | | | | 359/350 |
| 2017/0023713 | A1* | 1/2017 | Takiguchi | G02B 5/201 |
| 2017/0236860 | A1* | 8/2017 | Yamamoto | H01L 27/14618 |
| | | | | 257/432 |
| 2018/0120485 | A1* | 5/2018 | Oota | G02B 5/22 |

FOREIGN PATENT DOCUMENTS

| | | |
|---|---|---|
| CN | 105308124 A | 2/2016 |
| EP | 3009479 A1 | 4/2016 |
| JP | 2004-200360 A | 7/2004 |
| JP | 2007-141876 A | 6/2007 |
| JP | 2014-31435 A | 2/2014 |
| JP | 2014-031435 A | 2/2014 |
| JP | 2015-17244 A | 1/2015 |
| JP | 2015-017244 A | 1/2015 |
| KR | 10-2016-0006737 A | 1/2016 |
| TW | 201417257 A | 5/2014 |
| TW | 201510026 A | 3/2015 |
| WO | 2014/061188 A1 | 4/2014 |
| WO | WO 2014/061188 A1 * | 4/2014 ............. H01L 27/14 |

OTHER PUBLICATIONS

International Search Report and Written Opinion of PCT Application No. PCT/JP2016/001902, dated Jul. 5, 2016, 10 pages ISRWO.

* cited by examiner

IMAGE PICKUP DEVICE

CROSS REFERENCE TO RELATED APPLICATIONS

This application is a U.S. National Phase of International Patent Application No. PCT/JP2016/001902 filed on Apr. 5, 2016, which claims priority benefit of Japanese Patent Application No. JP 2015-107387 filed in the Japan Patent Office on May 27, 2015. Each of the above-referenced applications is hereby incorporated herein by reference in its entirety.

TECHNICAL FIELD

The present technology relates to an image pickup device that removes an infrared component from incident light on an image pickup device.

BACKGROUND ART

An imaging apparatus such as a video camera and a digital still camera is used for taking a color image, and a solid-state image pickup device (including a plurality of photoelectric conversion devices) such as a CCD (Charge Coupled Device) image sensor and a CMOS (Complementary Metal Oxide Semiconductor) image sensor used in these cameras has sensitivity also from the near ultraviolet wavelength band to the near infrared wavelength band.

However, in the case of taking a color image, for observation by persons, optical signals in a wavelength band other than the human visibility (approximately 400 to 700 nm in wavelength) are noise components for correct color images. Therefore, in order to acquire a correct color image, it is necessary to detect a signal from which light in the near infrared wavelength band is removed by providing an infrared cut filter in the photoelectric conversion device of the solid-state image pickup device.

The infrared cut filter is generally provided between an imaging optical system and the solid-state image pickup device, and an absorption-type infrared cut filter formed of a material absorbing the infrared band or a reflection-type infrared cut filter using interference of a multilayer film are used.

Incidentally, in recent years, although the imaging apparatus has been miniaturized, the infrared cut filter generally has a thickness of approximately 1 to 3 mm, and the thickness of the infrared cut filter is a problem in reducing the thickness of the digital camera. In particular, in a camera module mounted on a mobile phone, a portable terminal apparatus, or the like, it is necessary to reduce the thickness of the imaging optical system. In addition, it is necessary to mount the infrared cut filter together with the solid-state image pickup device on the imaging apparatus, and improvement is desired also from the viewpoint of manufacturing cost of the imaging apparatus.

Here, Patent Literature 1 discloses a solid-state image pickup device in which a flattening layer and an on-chip lens having infrared absorption capacity are laminated on a photoelectric conversion device. By providing the flattening layer and the on-chip lens with infrared absorption capacity, it is unnecessary to provide an infrared cut filter separately from the solid-state image pickup device, and the thickness of the imaging optical system can be reduced.

Further, Patent Literature 2 discloses a solid-state image pickup device in which an infrared absorption material is added to a color filter disposed on a photoelectric conversion device and an infrared component is removed by the color filter. Similarly in this solid-state image pickup device, it is unnecessary to separately provide an infrared cut filter, and the thickness of the imaging optical system can be reduced.

CITATION LIST

Patent Literature

Patent Literature 1: Japanese Patent Application Laid-open No. 2004-200360
Patent Literature 2: Japanese Patent Application Laid-open No. 2007-141876

DISCLOSURE OF INVENTION

Technical Problem

However, the solid-state image pickup device described in Patent Literature 1 or Patent Literature 2 has the following problem. That is, in the case of providing the on-chip lens or color filter with infrared absorption capacity, the thicknesses of them become large and incident light on the photoelectric conversion device may be optically affected.

When adding an infrared absorption material to the on-chip lens or color filter, a certain amount of infrared absorption material is necessary to achieve sufficient infrared absorption capacity. However, since the increase in the concentration of the infrared absorption material reduces the amount of visible light to be transmitted and makes it difficult to form a uniform film, the concentration of the infrared absorption material is limited. Therefore, it is inevitable to increase the thickness of the on-chip lens or the color filter.

Meanwhile, the increase in the thickness of the on-chip lens or color filter leads to the increase in the distance between the lens surface of the on-chip lens and the photoelectric conversion device. As a result, incident light on the on-chip lens provided on one photoelectric conversion device enters also an adjacent photoelectric conversion device, deteriorating the pixel resolution or color separation.

Further, in the case of providing an infrared absorption layer integrally with the solid-state image pickup device, the infrared absorption layer needs to be capable of withstanding temperatures exceeding 100° C. unlike the past, considering the manufacturing and assembly processes.

In the solid-state image pickup device described in Patent Literature 1, although a material having heat resistance exceeding 100° C. is described, it is difficult to realize the thickness of the on-chip lens from which sufficient infrared absorption properties can be achieved because the infrared absorption intensity conditions described above cannot be simultaneously satisfied. Further, it is difficult to carry out the solid-state image pickup device described in Patent Literature 2 from the viewpoint of heat resistance of the material with consideration of heat resistance exceeding 100° C.

Further, in the case of providing an infrared absorption layer integrally with the solid-state image pickup device, thermal deterioration of the infrared absorption layer is a problem. Specifically, since the infrared absorption layer is heated to approximately 80° C. to 180° C. during use of the solid-state image pickup device, it is necessary that the infrared absorption capacity is not impaired even when being exposed to such a temperature for a long time. For example, organic infrared absorption dyes such as cyanine dyes have low long-term heat resistance, and use of such dyes for the infrared absorption layer makes the durability of solid-state image pickup device insufficient.

In view of the circumstances as described above, it is an object of the present technology to provide an image pickup device that is capable of reducing the thickness of the imaging optical system without reducing the imaging capacity and has excellent durability.

Solution to Problem

In order to achieve the above-mentioned object, an image pickup device of an embodiment of the present technology is includes an on-chip lens, a low-refractive index layer, and an infrared absorption layer.

The on-chip lens is formed of a high-refractive index material.

The low-refractive index layer is formed to be flat on the on-chip lens, the low-refractive index layer being formed of a low-refractive index material.

The infrared absorption layer is formed of an infrared absorption material including at least one kind of organic infrared absorption dye and binder resin, a glass transition temperature of the binder resin being not less than 100° C., a concentration of the infrared absorption dye in the infrared absorption material being not less than 15 wt % and not more than 50 wt %, the infrared absorption layer being laminated above the low-refractive index layer.

With this configuration, since the image pickup device includes an infrared absorption layer, it is unnecessary to provide an infrared cut filter separately from the image pickup device, and reduce the thickness of the imaging optical system. Further, since the infrared absorption layer is laminated above the on-chip lens, the distance between the on-chip lens and the photoelectric conversion device (laminated below the on-chip lens) is equivalent that in the case where no infrared absorption layer is provided. In the case where the distance between the on-ship lens and the photoelectric conversion device increases, incident light on the on-chip lens enters an adjacent photoelectric conversion device, which may reduce the imaging capacity. However, with the above-mentioned configuration, the distance between the on-chip lens and the photoelectric conversion device does not increase, and such reduction of imaging capacity can be prevented. Further, by setting the concentration of the infrared absorption dye contained in the infrared absorption layer in the above-mentioned concentration range, it is possible to prevent the infrared absorption capacity from being reduced due to thermal oxidation of the infrared absorption dye, and improve the durability of the image pickup device. Specifically, in the case where the concentration of the infrared absorption dye is not less than 15 wt %, since a plurality of molecules in the infrared absorption dye aggregate and oxygen does not easily reach the infrared absorption dye, thermal oxidation is unlikely to occur. Further, in the case where the concentration of the infrared absorption dye is not more than 50 wt %, oxygen is shielded by binder resin around the infrared absorption dye, and thermal oxidation is unlikely to occur.

A heat yellowing temperature of the infrared absorption material may be not less than 180° C.

An image pickup device according to the present technology includes an infrared absorption layer unlike the case where an infrared absorption filter containing an infrared absorption dye is provided separately from an image pickup device. Here, although the infrared absorption layer is exposed to a high temperature in some cases during the manufacturing process or operation of the image pickup device, it is possible to prevent a visible light transmittance of the infrared absorption layer from being reduced due to heat, by using an infrared absorption material having a heat yellowing temperature of not less than 180° C.

A maximum absorption wavelength of the infrared absorption dye may be not less than 600 nm and not more than 1200 nm, and a molar absorption coefficient of the infrared absorption dye may be not less than 1000 L/mol·cm.

With this configuration, the infrared absorption material containing the infrared absorption dye is capable of effectively removing an infrared component in the infrared wavelength band (not less than 600 nm and not more than 1200 nm).

The infrared absorption dye may have an anion moiety that is larger in size or formula weight than a perchlorate ion or less easily oxidized, or a cation moiety that is larger in size or formula weight than an ammonium ion or less easily oxidized.

As the infrared absorption dye, dyes that can be formed into a lake can be used. However, these dyes have anionic or cationic moieties. By using the above-mentioned dye having anionic or cationic moieties as the infrared absorption dye, it is possible to prevent oxidation of the anionic or cationic moieties, and thermal deterioration of the infrared absorption layer.

The image pickup device may further include a protective layer laminated on the infrared absorption layer, the protective layer blocking oxygen and water or suppressing physical damage.

With this configuration, since the protective layer shields oxygen, the oxygen is prevented from reaching the infrared absorption layer. Accordingly, oxidation of the infrared absorption dye contained in the infrared absorption layer is prevented, and thus, it is possible to prevent the infrared absorption capacity from being reduced due to oxidation of the infrared absorption dye. Further, since the protective layer shields water or suppresses the physical damage, it is possible to prevent the deterioration of the infrared absorption layer.

The image pickup device may further include a band-pass layer laminated above the low-refractive index layer, the band-pass layer being formed of a multilayer film of a high-refractive index material and a low-refractive index material.

With this configuration, it is possible to remove a part or all of violet light, and light having a shorter wavelength than the violet light or infrared light, or both of them in the band-pass layer. Since the band-pass layer uses interference of light between the multilayer film, the transmission wavelength shifts depending on the incidence angle of incident light in some cases. Even in such a case, it is possible to maintain the transmission wavelength band by the infrared absorption layer in which shift of the transmission wavelength does not occur in principle.

The image pickup device may further include an antireflection layer laminated as an uppermost layer, the antireflection layer preventing light that enters the antireflection layer from an upper layer side and a lower layer side from being reflected.

The incident light on the image pickup device is slightly reflected on the interface of each layer in some cases. When such reflected light reaches the photoelectric conversion device of the image pickup device, light that is not the original imaging light enters the photoelectric conversion device, reducing the imaging capacity. Here, it is possible to prevent the reduction of imaging capacity by preventing such reflection of reflected light with the antireflection layer.

The image pickup device may further include a color filter layer laminated below the on-chip lens.

With this configuration, the incident light from which the infrared component is removed by the infrared absorption layer is converted into light in a predetermined wavelength band (e.g., red, green, blue) by the color filter provided corresponding to the photoelectric conversion device, and enters the photoelectric conversion device. That is, by providing the color filter layer, it is possible to capture a color image.

The color filter layer may have infrared absorption capacity.

With this configuration, it is possible to remove the infrared component of the incident light also by the color filter layer in addition to the infrared absorption layer. Since the absorption of the infrared component can be shared by the infrared absorption layer and the color filter layer, it is possible to sufficiently remove the infrared component without increasing the thickness of the color filter layer.

The image pickup device may further include a supporting substrate that supports the infrared absorption layer.

With this configuration, it is possible to prepare, separately from the lower layer structure (the photoelectric conversion layer, the on-chip lens, the low-refractive index layer, and the like), those obtained by laminating the infrared absorption layer on the supporting substrate, and laminate them on the lower layer structure. That is, since the lower layer structure and the infrared absorption layer can be prepared by difference manufacturing processes, it is advantageous in terms of manufacturing, e.g., existing facilities can be used.

The image pickup device may further include an adhesive layer laminated on the low-refractive index layer, the adhesive layer being formed of an adhesive material.

With this configuration, as described above, it is possible to laminate the supporting substrate on which the infrared absorption layer or the band-pass layer is laminated on the low-refractive index layer via the adhesive layer. Note that since the supporting substrate can be removed after adhesion, the image pickup device does not include the supporting substrate in some cases.

Advantageous Effects of Invention

As described above, according to the present technology, it is possible to provide an image pickup device that is capable of reducing the thickness of the imaging optical system without reducing the imaging capacity and has excellent durability.

MODE(S) FOR CARRYING OUT THE INVENTION

First Embodiment

An image pickup device according to a first embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 1:
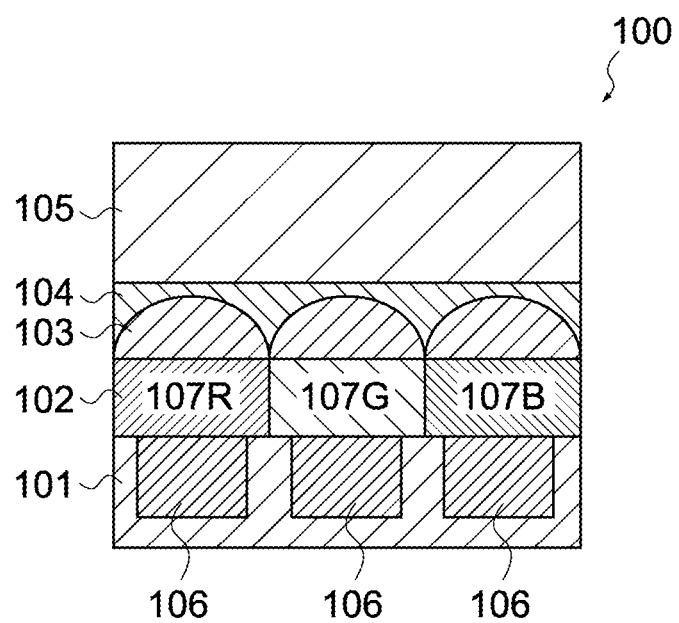
FIG. 1 is a schematic diagram of an image pickup device according to a first embodiment of the present technology.

FIG. 1 is a schematic diagram showing an image pickup device 100 according to this embodiment. As shown in the figure, the image pickup device 100 is configured by laminating a photoelectric conversion layer 101, a color filter layer 102, on-chip lenses 103, a low-refractive index layer 104, and an infrared absorption layer 105.

The photoelectric conversion layer 101 is a layer including a plurality of photoelectric conversion devices 106. Specifically, the photoelectric conversion layer 101 may be obtained by forming a circuit of the photoelectric conversion devices 106 on a substrate such as a silicon substrate. The structure of the photoelectric conversion layer 101 may be the structure of a CCD (Charge Coupled Device) or the structure of a CMOS (Complementary Metal Oxide Semiconductor).

The photoelectric conversion layer 101 may be an image sensor in which the photoelectric conversion devices 106 are arranged two-dimensionally (in a matrix), or may be a line sensor in which the photoelectric conversion devices 106 are arranged one-dimensionally (linearly).

The color filter layer 102 is laminated on the photoelectric conversion layer 101, and includes color filters corresponding to the respective photoelectric conversion devices 106. Specifically, the color filters may be three types of color filters of a red color filter 107R that causes a red wavelength band to be transmitted therethrough, a green color filter 107G that causes a green wavelength band to be transmitted therethrough, and a blue color filter 107B that causes a blue wavelength band to be transmitted therethrough. Hereinafter, the red color filter 107R, the green color filter 107G, and the blue color filter 107B are collectively referred to as the color filter 107.

The type (transmission wavelength) of the color filter 107 is not limited to the above-mentioned three colors. The material of each color filter 107 is not particularly limited, and the color filter 107 may be formed of a well-known material. As shown in FIG. 1, the color filter 107 having any one of the three types of transmission wavelengths can be provided on the upper layer of each photoelectric conversion device 106. As a result, light having a particular wavelength band, which is transmitted through the color filter 107 on the upper layer enters each photoelectric conversion device 106, and the output thereof can be the intensity of the light in the wavelength band, which is transmitted through the color filter 107.

Note that it does not necessary need to provide the color filter layer 102. In the case of providing no color filter layer 102, a monochrome image is generated from the output of each photoelectric conversion device 106. In this case, the on-chip lenses 103 may be provided on the photoelectric conversion layer 101, or may be provided via some layer.

The on-chip lenses 103 are formed on the color filter layer 102, and collect the incident light on the photoelectric conversion devices 106 via the color filter 107. As shown in FIG. 1, the on-chip lenses 103 may be formed corresponding to the respective photoelectric conversion devices 106. However, one on-chip lens 103 may be formed corresponding to the plurality of photoelectric conversion devices 106.

The on-chip lenses 103 may each be formed of a high-refractive index material having optical transparency, and may have a hemispherical shape or a shape that functions as a lens. Accordingly, the light that enters the on-chip lens 103 from the low-refractive index layer 104 having a refractive index smaller than that of the on-chip lens 103 is refracted on the interface between the low-refractive index layer 104 and the on-chip lens 103, and is collected on the photoelectric conversion device 106 corresponding to the on-chip lens 103.

The low-refractive index layer 104 is formed to be flat on the on-chip lens 103. That is, the lens shape (hemispherical shape or the like) of the on-chip lens 103 is embedded by the low-refractive index layer 104. The low-refractive index layer 104 may be formed of a material that has a refractive index smaller than that of at least the on-chip lens 103 and optical transparency. Note that the larger the refractive index difference between the low-refractive index layer 104 and the on-chip lens 103, the greater the lens effect of the on-chip lens 103, which is preferable.

The infrared absorption layer 105 is laminated on the low-refractive index layer 104, and removes an infrared component from the incident light on the image pickup device 100. Since the low-refractive index layer 104 is formed to be flat as described above, the infrared absorption layer 105 can be laminated to have a certain thickness regardless of the shape of the on-chip lens 103. The infrared absorption layer 105 is preferably formed of a material that has a high absorption rate of the infrared component and a high visible light transmittance. Details of such a material will be described later.

The thickness of the infrared absorption layer 105 is preferably not less than 1 μm and not more than 500 μm, and favorably not more than 200 μm. In the image pickup device 100 according to this embodiment, since the thickness of the infrared absorption layer 105 does not affect the distance between the on-chip lens 103 and the photoelectric conversion device 106, the infrared absorption layer 105 can have a sufficient thickness required for removing the infrared component.

[Operation of Image Pickup Device]

Figure 2:
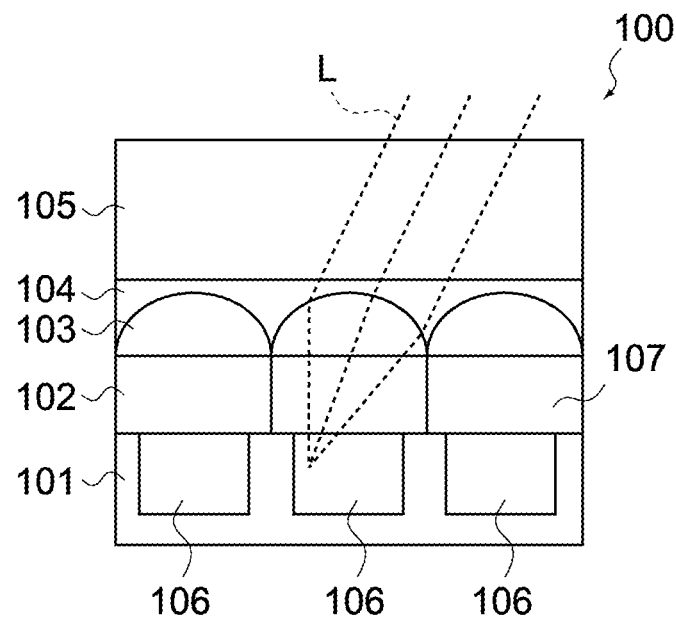
FIG. 2 is a schematic diagram showing an operation of the image pickup device.

The operation of the image pickup device 100 having the above-mentioned configuration will be described. FIG. 2 is a schematic diagram showing incident light (shown as incident light L) on the image pickup device 100. As shown in the figure, the incident light L is transmitted through the infrared absorption layer 105, the low-refractive index layer 104, the on-chip lens 103, and the color filter layer 102 to reach the photoelectric conversion device 106.

The component in the infrared wavelength band contained in the incident light L (hereinafter, infrared component) is removed by the infrared absorption layer 105, the incident light L is refracted on the interface between the low-refractive index layer 104 and the on-chip lens 103, and collected toward the photoelectric conversion device 106. The component other than those in the transmission wavelength band of the color filter 107 is removed by the color filter layer 102, and photoelectric conversion is performed by the photoelectric conversion device 106.

[Effect of Image Pickup Device]

Figure 3:
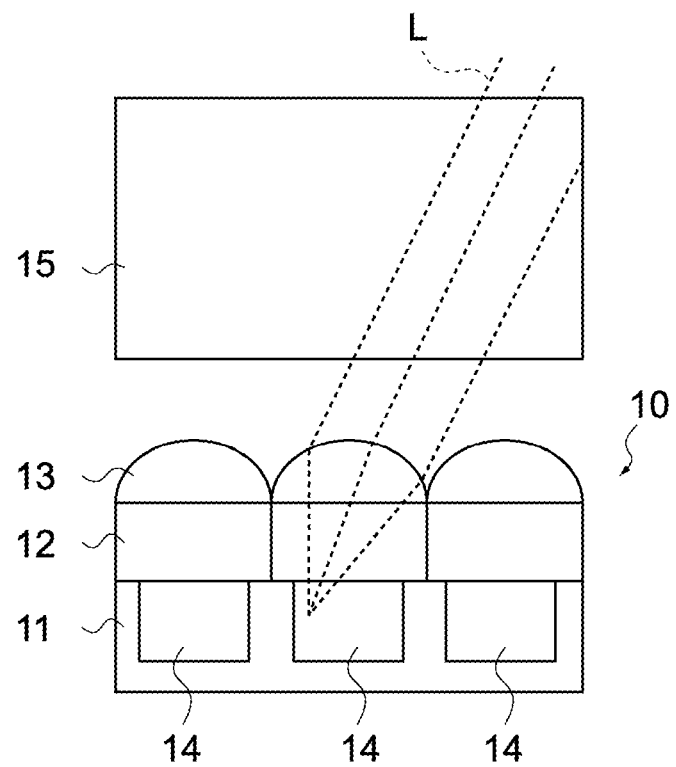
FIG. 3 is a schematic diagram showing an operation of an image pickup device according to a comparative example.
Figure 4:
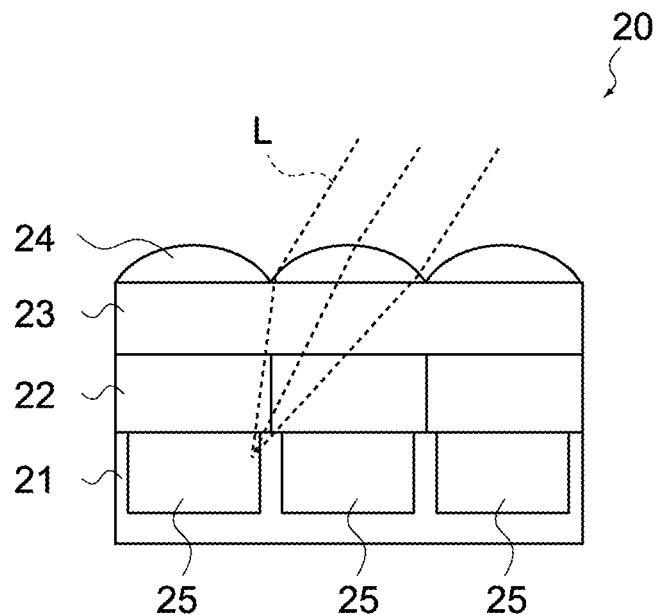
FIG. 4 is a schematic diagram showing an operation of an image pickup device according to a comparative example.
Figure 5:
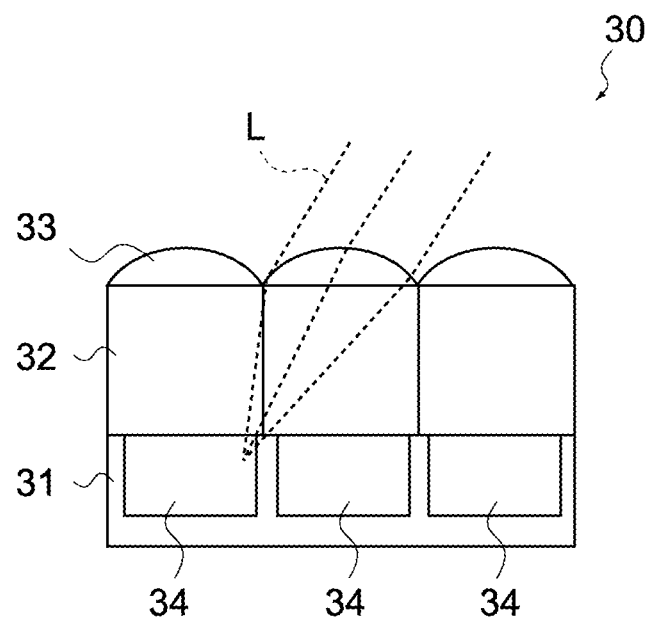
FIG. 5 is a schematic diagram showing an operation of an image pickup device according to a comparative example.

The effect of the image pickup device 100 according to this embodiment will be described in comparison with comparative examples. FIGS. 3 to 5 are each a schematic diagram showing an image pickup device according to an existing technology as a comparative example.

FIG. 3 is a schematic diagram showing an image pickup device 10 according to a comparative example. The image pickup device 10 is configured by laminating a photoelectric conversion layer 11, a color filter layer 12, and on-chip lenses 13 in the stated order. In the photoelectric conversion layer 11, a plurality of photoelectric conversion devices 14 are formed. As shown in the figure, since the image pickup device 10 cannot prevent, by itself, an infrared component from entering the photoelectric conversion devices 14, the image pickup device 10 needs to be mounted on an imaging apparatus (not shown), together with the infrared cut filter 15. The infrared cut filter 15 may be an infrared absorption filter formed of an infrared absorption material, or a multi-layer film in which a high-refractive index material and a low-refractive index material are alternately laminated many times.

As shown in FIG. 3, the incident light L is transmitted through the infrared cut filter 15, enters the image pickup device 10, is transmitted through the on-chip lens 13 and the color filter layer 12, and reaches the photoelectric conversion device 14. Here, although the infrared cut filter 15 needs to be mounted on an imaging apparatus separately from the image pickup device 10 as described above, the infrared cut filter 15 needs to have a certain thickness (approximately 1 to 3 mm) in order to maintain the strength or the like. Therefore, the infrared cut filter 15 makes it difficult to reduce the thickness of the imaging optical system.

Meanwhile, in the image pickup device 100 according to this embodiment shown in FIG. 2, since the infrared component of the incident light L is removed by the infrared absorption layer 105, it does not necessary to provide the infrared cut filter separately from the image pickup device 100, and it is possible to reduce the thickness of the imaging optical system.

Further, FIGS. 4 and 5 are each a schematic diagram showing an image pickup device according to another comparative example.

An image pickup device 20 (corresponding to Patent Literature 1 that is the prior art literature) according to a comparative example shown in FIG. 4 is configured laminating a photoelectric conversion layer 21, a color filter layer 22, an infrared absorption layer 23, and on-chip lenses 24 in the stated order. In the photoelectric conversion layer 21, a plurality of photoelectric conversion devices 25 are formed. The infrared absorption layer 23 is a layer formed of an infrared absorption material.

Since the image pickup device 20 includes the infrared absorption layer 23, it does not necessary to provide the infrared cut filter independent of the image pickup device 20 unlike the above-mentioned image pickup device 10, and it is possible to reduce the thickness of the imaging optical system. However, in the configuration of the image pickup device 20, the following problem occurs.

As shown in FIG. 4, the incident light L is collected by the on-chip lens 24, is transmitted through the infrared absorption layer 23 and the color filter layer 22, and reaches the photoelectric conversion device 25. Here, the existence of the infrared absorption layer 23 formed between the on-chip lens 24 and the color filter layer 22 makes the distance between the on-chip lens 24 and the photoelectric conversion device 25 large. This is because the infrared absorption layer 23 needs to have a certain thickness in order to have sufficient infrared absorption capacity. Here, since the distance between the on-chip lens 24 and the photoelectric conversion device 25 is made large, the curvature of the on-chip lens 24 is adjusted so that light is collected at the position of the photoelectric conversion device 25.

As a result, as shown in FIG. 4, the incident light L that enters the on-chip lens 24 at an angle enters not the photoelectric conversion device 25 corresponding to the on-chip lens 24 but the photoelectric conversion device 25 adjacent thereto in some cases. As a result, the pixel resolution or color separation is deteriorated.

An image pickup device 30 (corresponding to Patent Literature 2 that is the prior art literature) according to a comparative example shown in FIG. 5 is configured by laminating a photoelectric conversion layer 31, a color filter/infrared absorption layer 32, and on-chip lenses 33 in the stated order. In the photoelectric conversion layer 31, a plurality of photoelectric conversion devices 34 are formed. The color filter/infrared absorption layer 32 is a layer having both of a function of a color filter and a function of infrared absorption.

Since also the image pickup device 30 includes the color filter/infrared absorption layer 32, it does not necessary to provide the infrared cut filter independent of the image pickup device 30, and it is possible to reduce the thickness of the imaging optical system similarly to the image pickup device 20. However, also the color filter/infrared absorption layer 32 needs to have a certain thickness in order to have sufficient infrared absorption capacity. Therefore, similarly to the case of the image pickup device 20, such a problem that incident light on the on-chip lens 33 enters not the photoelectric conversion device 34 corresponding to the on-chip lens 33 but the photoelectric conversion device 34 adjacent thereto occurs. Here, since the distance between the on-chip lens 33 and the photoelectric conversion device 34 is made large, the curvature of the on-chip lens 33 is adjusted so that light is collected at the position of the photoelectric conversion device 25.

Meanwhile, in the image pickup device 100 according to this embodiment shown in FIG. 2, the infrared absorption layer 105 is formed above the on-chip lens 103. That is, the distance between the on-chip lens 103 and the photoelectric conversion device 106 is similar to that in the existing structure (the image pickup device 10, see FIG. 3) regardless of the thickness of the infrared absorption layer 105, and the problem caused due to the incident light L entering the adjacent photoelectric conversion device 106 in the image pickup device 20 or the image pickup device 30 according to the comparative example does not occur. In other words, the image pickup device 100 according to this embodiment is capable of reducing the thickness of the imaging optical system without reducing the imaging capacity (resolution and the like).

[Regarding Infrared Absorption Material]

As described above, the infrared absorption layer 105 of the image pickup device 100 is formed of an infrared absorption material having infrared absorption capacity. The heat yellowing temperature (temperature at which the infrared absorption material is deteriorated to yellow) of the infrared absorption material constituting the infrared absorption layer 105 is preferably not less than 100° C., and favorably not less than 180° C., and the Mp (melting point) of the infrared absorption material is preferably not less than 100° C., and favorably not less than 180° C. This is because the infrared absorption layer 105 is included in the image pickup device 100 unlike the case of the image pickup device 10 according to the comparative example in which the infrared cut filter 15 is provided separately from the image pickup device 10. That is, a material that does not yellow even in the case where the infrared absorption layer 105 is exposed to a high temperature in the manufacturing process or operation of the image pickup device 100 is preferable as the infrared absorption material.

The infrared absorption material may contain at least an infrared absorption dye (wavelength-selective absorption dye), or those obtained by mixing an infrared absorption dye in binder resin. Further, the infrared absorption material may contain an additive (leveling agent, dispersing agent, etc.).

(Infrared Absorption Dye)

As the infrared absorption dye, a dye that has the maximum absorption wavelength in the range of not less than 600 nm and not more than 1200 nm and a molar absorption coefficient of not less than 1000 L/mol·cm in the range is preferable. In order to ensure transparency in the visible region, it is desirably that the ratio of the molar absorption coefficient of the maximum absorption wavelength in the infrared region of the dye and the molar absorption coefficient of the maximum absorption wavelength in the visible region of the dye is not more than 0.1.

Further, the infrared absorption dye preferably has the decomposition temperature of not less than 100° C., and favorably not less than 180° C. This is because it is necessary that the infrared absorption capacity is not lost even in the case where the infrared absorption layer 105 is exposed to a high temperature in the manufacturing process or operation of the image pickup device 100 as described above. Note that it is also possible to improve the decomposition temperature of the infrared absorption dye by the additive to be described later. Two or more types of infrared absorption dyes may be contained in the infrared absorption material, and a combination of infrared absorption dyes that provide spectral characteristics suitable for imaging can be appropriately selected.

Specifically, examples of the infrared absorption dye include those containing a dithiol complex, an aminothiol complex, an azo complex, phthalocyanine, naphthalocyanine, a phosphate ester copper complex, a nitroso compound, and a metal complex thereof as main skeleton. The metal part of the complex can be selected from iron, magnesium, nickel, cobalt, copper, vanadium, zinc, palladium, platinum, titanium, indium, tin, chromium, scandium, manganese, and the like, and also oxides such as titanyl and vanadyl can be selected. Further, also the element of the coordination moiety can be selected from various halogens and an organic ligand having a moiety such as a amine group, a nitro group, and a thiol group. Further, a substitution group such as an alkyl group, a hydroxyl group, a carboxyl group, an amino group, a nitro group, a cyano group, a fluorinated alkyl group, and ether may be introduced.

Further, examples of the infrared absorption dye include methine dyes such as cyanine and merocyanine, and organic compounds such as a triarylmethane-based compound, squarylium, anthraquinone, naphthoquinone, quaterrylene, perylene, styryl, immonium, diimmonium, croconium, oxanol, aminium salt, pyrrolopyrrole derivatives, quinone derivatives, and dye lakes. Into each organic compound, a substitution group such as an alkyl group, a hydroxyl group, a carboxyl group, an amino group, a nitro group, a cyano group, a fluorinated alkyl group, and ether may be introduced.

Further, examples of the infrared absorption dye include metal oxides such as an ITO (Indium Tin Oxide), an AZO (Al doped zinc oxide), a tungsten oxide, an antimony oxide, cesium tungsten, and an iron oxide. These metal oxides may be a film or a particulate stationary matter.

Further, as the infrared absorption dye, a substance having an anion moiety that is larger in size or formula weight than the perchlorate ion or less easily oxidized, or a cation moiety that is larger in size or formula weight than the ammonium ion or less easily oxidized can also be used. As the infrared absorption dye, although dyes that can be formed into a lake such as methine dyes and diimmonium can be used, these dyes have an anion moiety or a cation moiety.

Examples of the anion that is larger in size or formula weight than the perchlorate ion or less easily oxidized include a peroxide anion such as a perbromic acid anion and a periodic acid anion, a fluoride anion such as a hexafluorophosphate anion, an antimony hexafluoride anion, and a bismuth hexafluoride anion, an alkylsulfonic acid anion derivative, tosylate, an alkylsulfonylimide anion derivative, a cyan-based anion, a boron-based anion represented by tetraphenylborate, saccharinate, and acesulfamate. Examples of the cation that is larger in size or formula weight than the ammonium ion or less easily oxidized include an ammonium cation derivative, an imidazolium derivative, a pyridinium derivative, a pyrrolidinium derivative, a phosphonium derivative, and a sulfonium derivatives.

In the infrared absorption dye having these anion moieties or the cation moieties, the anion moiety or the cation moiety is not easily oxidized. Therefore, it is possible to prevent the infrared absorption dye from being oxidized due to heating of the infrared absorption layer 105 during use of the image pickup device 100, i.e., to prevent the infrared absorption layer 105 from being thermally deteriorated.

(Binder Resin)

The binder resin may be a high molecular weight substance or a low molecular weight substance. In the case of a high molecular weight substance, those having the decomposition temperature of not less than 100° C., and favorably not less than 180° C., and the Tg (glass transition temperature) of not less than 100° C., and favorably not less than 180° C. are preferable. Further, those having the heat yellowing temperature of not less than 100° C., and favorably not less than 180° C. are most preferable. This makes it possible to prevent the infrared absorption capacity of the infrared absorption material and the visible light transparency from being reduced.

In the case of a low molecular weight substance, those that are crosslinked by heating, irradiation with ultraviolet light, or the like after film formation, generating the high molecular weight substance after the crosslinking reaction, which has the decomposition temperature of not less than 100° C., and favorably not less than 180° C., and the Tg (glass transition temperature) of not less than 100° C., and favorably not less than 180° C., are preferable. Further, those having the heat yellowing temperature of not less than 100° C., and favorably not less than 180° C. are most preferable. This makes it possible to prevent the infrared absorption capacity of the infrared absorption material and the visible light transparency from being reduced.

Further, in the case where the crosslinking reaction is necessary, a crosslinking agent, a reaction initiator (e.g., a photopolymerization initiator or a thermal polymerization initiator), or the like, which serves as a reaction aid, may be necessary in some cases. These reaction aids are appropriately selected depending on the low molecular weight substance (monomer) to be used, it is preferable that any of the high molecular weight substance, the low molecular weight substance, and the reaction aid does not have the absorption maximum wavelength in the range of 400 to 600 nm (visible light wavelength band).

Even in the case where the heat yellowing temperature of the binder resin is less than 100° C., oxide fine particles may be mixed in the resin to improve the heat yellowing temperature. Note that the oxide fine particles correspond to the additive to be described later.

Specifically, examples of the binder resin include resin having epoxy, acryl, or vinyl in the terminal structure. Further, those having silicone, polycarbonate, polyethylene sulfone, polyimide, norbornene, other polyfunctional polymers (desirably tri-or higher functional), polysaccharides, or a cellulose structure in the skeleton of the main chain have a high heat yellowing temperature and is preferable.

Further, as the binder resin, resin that is unlikely to oxidize the infrared absorption dye is preferable. Specifically, synthetic resin containing only a siloxane skeleton and synthetic resin containing a siloxane skeleton moiety and a partial skeleton with low reactivity of an oxygen moiety can be used as the binder resin. Examples of an organic group with high reactivity of an oxygen moiety include a carbonyl group, and examples of an organic group with low reactivity of an oxygen moiety include ether, a vinyl group, amine, and an alkyl group. Therefore, a siloxane polymer containing only a siloxane skeleton, silicone containing a siloxane skeleton and an organic group with low reactivity of an oxygen moiety, and the like can be used as the binder resin. The polymer resin may be mixed or copolymerized. For example, a graft copolymer containing an epoxy polymer and dimethylpolysiloxane may be used. Note that among them, those having high transparency in the visible region are particularly preferable as the binder resin.

If resin having an organic group with high reactivity of an oxygen moiety is used as the binder resin, oxygen of the organic group is donated to the infrared absorption dye due to heating of the infrared absorption layer 105 during use of the image pickup device 100, and the infrared absorption dye is oxidized. As a result, the infrared absorption capacity of the infrared absorption layer 105 is impaired. By using synthetic resin containing only a siloxane skeleton or synthetic resin containing a siloxane skeleton moiety and a moiety having no organic group with high reactivity of an oxygen moiety as the binder resin, it is possible to prevent the infrared absorption dye from being oxidized by the binder resin, i.e., to prevent the infrared absorption capacity of the infrared absorption layer 105 from being thermally deteriorated.

(Additive)

Examples of the additive include a leveling agent, a dispersion aid (surfactant, etc.), an antioxidant, and a dye stabilizer. It is preferable that these additives have no absorption maximum wavelength in the visible light wavelength band of 400 to 600 nm are preferable. Further, the additive preferably has the decomposition temperature of not less than 100° C., and favorably not less than 180° C. In particular, in the case of using a stabilizer or antioxidant of the infrared absorption dye, the heat yellowing temperature of the infrared absorption material becomes not less than 100° C. by these additives even in the case where the decomposition temperature of the infrared absorption dye or binder resin is not more than 100° C. in some cases. In this case, the decomposition temperature of the infrared absorption dye and binder resin does not necessarily need to be not less than 100° C.

Further, photodeterioration is a problem depending on the infrared absorption dye or binder resin to be used, in some cases. In the case where the light resistance is a problem as described above, an additive for suppressing photodeterioration may be used. Examples of the additive for suppressing photodeterioration include an additive for suppressing singlet oxygen or a stabilizer for an excitation dye. Examples of a light stabilizer include a metal complex such as a nickel dithiol complex, a nickel complex, a copper thiol complex, and a cobalt thiol complex, a TCNQ (tetracyanoquinodimethane) derivative, a phenol-based light stabilizer, a phosphorus-based light stabilizer, a hindered amine-based light stabilizer, and an anthracene derivative, and metal oxide fine particles such as a copper oxide and an iron oxide. These are not particularly limited, but additive that do not change the heat resistance or spectral characteristics of the infrared absorption dye are more desirable.

Further, in the case of adding a particulate infrared absorption dye, a surfactant may be added to suppress reaggregation of particles. The surfactant is appropriately selected depending on the surface state of the infrared absorption dye contained in the infrared absorption layer 105, and is desirably a substance that is capable of expressing a function of satisfactorily dispersing a dye in the resin composition and absorbs no light in the visible region.

The surfactant is roughly classified into those having an ionic (cationic, anionic, zwitterionic) hydrophilic portion and those having a non-ionic (nonionic) hydrophilic portion. Further, it is classified into a low molecular-type surfactant and a high molecular-type surfactant depending on the molecular weight. A substance having a carboxylic acid, a sulfonic acid, or a phosphoric acid structure as a hydrophilic group is known as a dispersing agent that becomes an anion when being dissociated in water. Specific examples of the substance include a soap (fatty acid sodium), a monoalkyl sulfate, an alkyl polyoxyethylene sulfate, an alkylbenzene sulfonate, and a monoalkyl phosphate. A dispersing agent that becomes a cation when being dissociated in water is known.

There is a positive ion-based surfactant (cationic surfactant) having tetraalkylammonium as a hydrophilic group. Specific example of the cationic surfactant include an alkyl trimethyl ammonium salt, a dialkyl dimethyl ammonium salt, and an alkyl benzyl dimethyl ammonium salt. Further, an amphoteric surfactant (zwitterionic surfactant) having a structure combining each of the above, which has both an anionic site and a cationic site in the molecule and becomes a positive/amphoteric/negative ion depending on the pH of the solution, is known. Specific examples of the zwitterionic surfactant include alkyldimethylamine oxide and alkylcarboxybetaine Meanwhile, a non-ionic surfactant (nonionic surfactant) of a low molecular weight substance, in which the hydrophilic part has a non-electrolyte, i.e., a hydrophilic part that does not ionize, such as alkyl glycoside, a polyhydric alcohol ester-based surfactant, and a higher alcohol alkylene oxide-based surfactant, is known. Specific examples of the nonionic surfactant include fatty acid sorbitan ester, alkyl polyglucoside, fatty acid diethanol amide, and alkyl monoglyceryl ether.

Examples of a high molecular-type dispersing agent include an anionic dispersing agent such as a polycarboxylic acid-based dispersing agent, a naphthalenesulfonic acid formalin condensation-based dispersing agent, and a polycarboxylic acid alkyl ester-based dispersing agent, a polyalkylene polyamine-based cationic dispersant, and a non-ionic (nonionic) dispersing agent such as polyethylene glycol, polyvinyl alcohol, and a polyether-based dispersing agent. Among them, it is more desirable to add a high molecular-type surfactant in which a phenomenon such as bleeding is unlikely to occur.

As described above, the infrared absorption material to be the infrared absorption layer 105 may contain an infrared absorption dye, binder resin, and an additive optionally added thereto. Note that the infrared absorption layer 105 needs to adhere closely to the low-refractive index layer 104 as a lower layer with sufficient adhesion, and it is necessary that cracks, white turbidity, peeling, and the like do not occur by heating. The adhesion of the infrared absorption layer 105 depends on the adhesion of the dye material in the case of a single infrared absorption dye, and on the adhesion of the binder resin in the case where the binder resin is a main component of the infrared absorption material. Further, in the case where sufficient adhesion cannot be achieved with the infrared absorption dye or binder resin, the adhesion may be improved by using an additive.

The infrared absorption layer 105 can be formed by depositing the above-mentioned infrared absorption material on the low-refractive index layer 104 by a film formation method such as a vapor deposition method, a sputtering method, and a coating method. In particular, the film formation method capable of forming the infrared absorption layer 105 to have a uniform thickness is preferable.

(Concentration of Infrared Absorption Dye)

In the case where the infrared absorption dye in the infrared absorption material constituting the infrared absorption layer 105 is an organic infrared absorption dye, the concentration of the infrared absorption dye is preferably not less than 15 wt % and not more than 50 wt % with respect to the total amount of the infrared absorption dye and the binder resin.

In the case where the concentration of the infrared absorption dye is less than 15 wt %, since the infrared absorption dye exists in molecular units, oxygen easily reaches the infrared absorption dye, and the infrared absorption capacity is likely to be reduced due to thermal oxidation the infrared absorption dye. Meanwhile, in the case where the concentration of the infrared absorption dye is not less than 15 wt %, since a plurality of molecules of the infrared absorption dye aggregate and oxygen does not easily reach the infrared absorption dye, thermal oxidation is unlikely to occur (see examples).

Further, in the case where the concentration of the infrared absorption dye is more than 50 wt %, the binder resin surrounding the infrared absorption dye is insufficient for blocking oxygen, and the infrared absorption capacity is likely to be reduced by thermal oxidation of the infrared absorption dye. Meanwhile, in the case where the concentration of the infrared absorption dye is not more than 50 wt %, oxygen is blocked by the binder resin surrounding the infrared absorption dye, and thermal oxidation is unlikely to occur (see examples).

That is, by setting the concentration of the infrared absorption dye to not less than 15 wt % and not more than 50 wt % with respect to the total amount of the infrared absorption dye and the binder resin, it is possible to prevent the infrared absorption dye from being thermally oxidized, and maintain the infrared absorption capacity of the infrared absorption layer 105 for a long time. This concentration range of the infrared absorption dye is effective for all organic infrared absorption dyes in which thermal deterioration can occur due to oxygen.

Note that the infrared absorption material may contain a plurality of types of organic infrared absorption dyes. In this case, the concentration of the respective organic infrared absorption dyes is preferably not less than 15 wt % and not more than 50 wt % with respect to the total amount of the each type of infrared absorption dye and the binder resin. Further, the infrared absorption material may contain an organic infrared absorption dye and an inorganic infrared absorption dye. In this case, the concentration of the organic infrared absorption dye is preferably not less than 15 wt % and not more than 50 wt % with respect to the total amount of the infrared absorption dye and the binder resin. Further, the infrared absorption material may contain only an inorganic infrared absorption dye. The concentration of the inorganic infrared absorption dye does not affect the thermal deterioration of the inorganic infrared absorption dye.

[Regarding Combination with Infrared Cut Filter]

Figure 6:
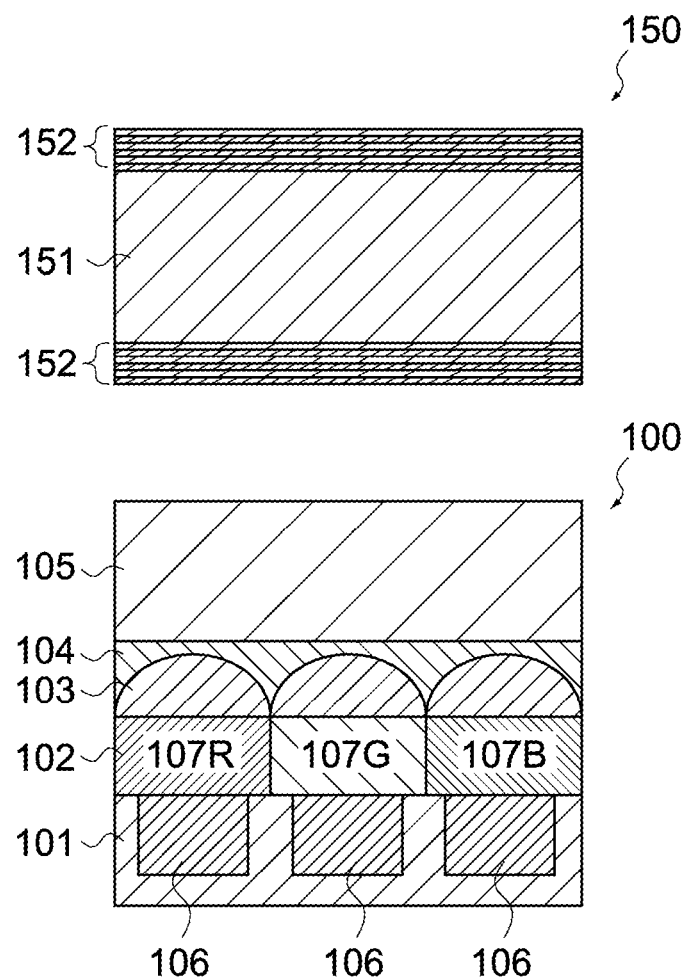
FIG. 6 is a schematic diagram of the image pickup device according to the first embodiment of the present technology and an infrared cut filter.

The image pickup device 100 according to this embodiment can also be used together with the infrared cut filter. FIG. 6 is a schematic diagram showing an infrared cut filter 150 mounted together with the image pickup device 100. As shown in the figure, the infrared cut filter 150 may be a multilayer infrared cut filter.

Specifically, the infrared cut filter 150 may be obtained by forming a multilayer film 152 on both surfaces of a supporting substrate 151. The multilayer film 152 may be obtained by alternately laminating a layer formed of a high-refractive index material and a layer formed of low-refractive index material, and reflects only the infrared component by interference of light between these layers, and causes visible light to be transmitted therethrough. Note that the infrared cut filter 150 is not limited to the multilayer infrared cut filter, and may remove the infrared component in accordance with another principle.

By using the image pickup device 100 together with the infrared cut filter 150, the infrared absorption layer 105 of the image pickup device 100 and the infrared cut filter 150 make it possible to compensate for transmission wavelength bands of each other (described later). Further, since the infrared removable amount can be shared by both of them, it is also possible to reduce the thickness of the infrared absorption layer 105.

Second Embodiment

An image pickup device according to a second embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 7:
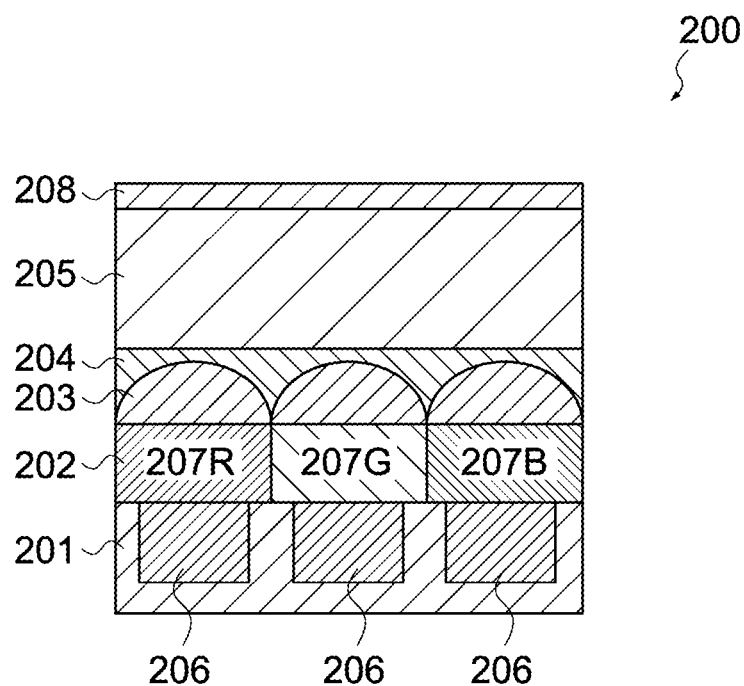
FIG. 7 is a schematic diagram of an image pickup device according to a second embodiment of the present technology.

FIG. 7 is a schematic diagram showing an image pickup device 200 according to this embodiment. As shown in the figure, the image pickup device 200 is configured by laminating a photoelectric conversion layer 201, a color filter layer 202, on-chip lenses 203, a low-refractive index layer 204, an infrared absorption layer 205, and an antireflection layer 208.

The photoelectric conversion layer 201, the color filter layer 202, the on-chip lenses 203, the low-refractive index layer 204, and the infrared absorption layer 205 may have configurations similar to those in the first embodiment. In the photoelectric conversion layer 201, a plurality of photoelectric conversion devices 206 are formed. The color filter layer 202 includes a red color filter 207R, a green color filter 207G, and a blue color filter 207B (hereinafter, collectively referred to as the color filter 207) corresponding to the respective photoelectric conversion devices 206.

The antireflection layer 208 is laminated as the uppermost layer of the image pickup device 200 on the infrared absorption layer 205, and prevents reflection of incident light from the upper side and incident light from the lower layer (infrared absorption layer 205). The incident light on the image pickup device 200 is transmitted through the antireflection layer 208, the infrared absorption layer 205, and the low-refractive index layer 204, collected by the on-chip lens 203, transmitted through the color filter layer 202, and reaches the photoelectric conversion device 206.

Here, a part of the incident light is reflected on the interface of each layer, becomes reflected light, and travels toward the upper layer in some cases.

Assuming that no antireflection layer 208 is provided, reflected light from the lower layer side is reflected again on the interface between the infrared absorption layer 205 and the air, and enters another photoelectric conversion device 206, which may reduce the pixel resolution. Here, by preventing the reflected light from being reflected again on the interface between the air and the infrared absorption layer 205 by the antireflection layer 208, it is possible to prevent the reflected light from reaching another photoelectric conversion device 206.

The antireflection layer 208 may be formed of an arbitrary material that reduces the light reflectance on the interface between the air and the infrared absorption layer 205. Further, by making the antireflection layer 208 formed of a material capable of blocking oxygen, it is possible to prevent oxygen from reaching the infrared absorption layer 205, and the infrared absorption dye contained in the infrared absorption layer 205 from being oxidized. Further, by making the antireflection layer 208 formed of a material that is physically or chemically strong, it is also possible to prevent physical or chemical damage of the lower layer.

Third Embodiment

An image pickup device according to a third embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 8A:
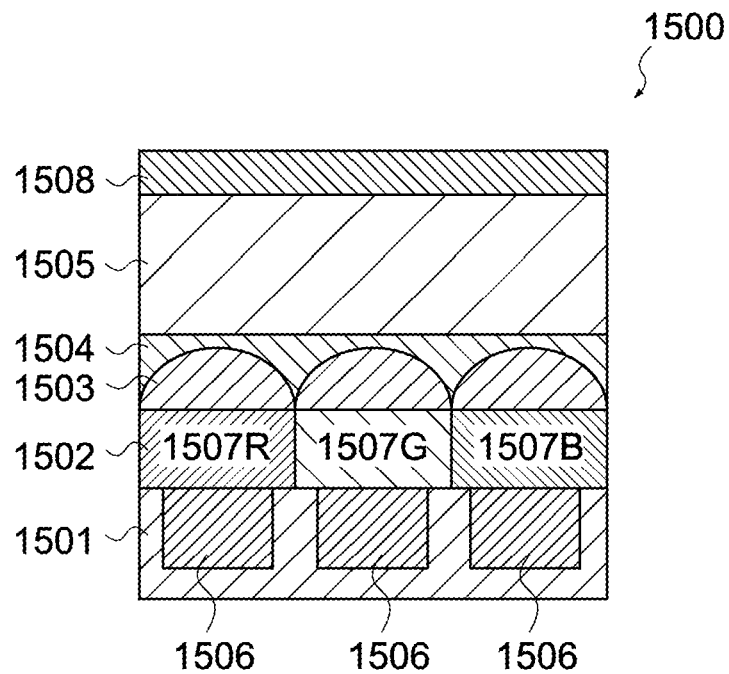
FIGS. 8(a) and 8(b) are schematic diagrams of an image pickup device according to a third embodiment of the present technology.
Figure 8B:
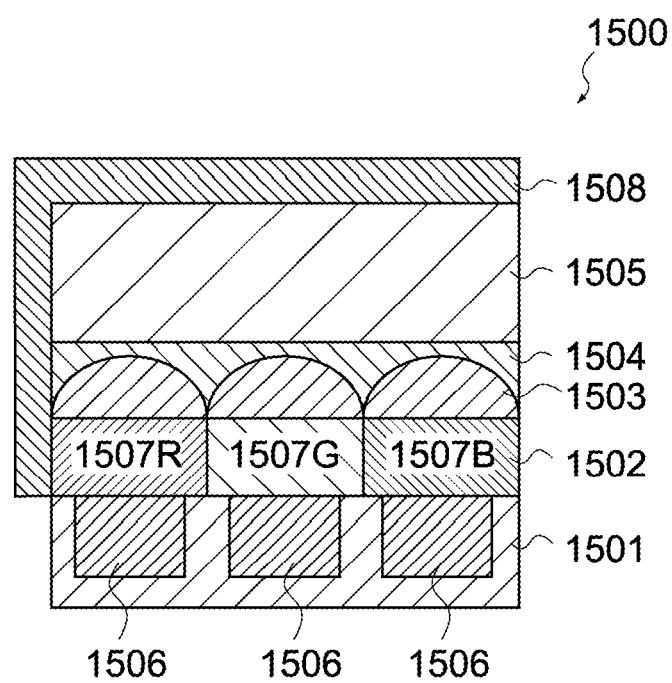

FIGS. 8(a) and 8(b) are schematic diagrams showing an image pickup device 1500 according to this embodiment. FIG. 8(a) shows the central portion of the image pickup device 1500, and FIG. 8 shows an end portion (outer peripheral portion) of the image pickup device 1500. As shown in the figure, the image pickup device 1500 is configured by laminating a photoelectric conversion layer 1501, a color filter layer 1502, on-chip lenses 1503, a low-refractive index layer 1504, an infrared absorption layer 1505, and a protective layer 1508.

The photoelectric conversion layer 1501, the color filter layer 1502, the on-chip lenses 1503, the low-refractive index layer 1504, and the infrared absorption layer 1505 may have configurations similar to those in the first embodiment. In the photoelectric conversion layer 1501, a plurality of photoelectric conversion devices 1506. The color filter layer 1502 includes a red color filter 1507R, a green color filter 1507G, and a blue color filter 1507B (hereinafter, collectively referred to as the color filter 1507) corresponding to the respective photoelectric conversion devices 1506.

The protective layer 1508 is laminated on the infrared absorption layer 1505, and blocks oxygen and water or suppresses physical damage. By the protective layer 1508 blocking oxygen, oxygen is prevented from reaching the infrared absorption layer 1505, and the infrared absorption dye contained in the infrared absorption layer 1505 is prevented from being oxidized.

The protective layer 1508 can be formed of a material capable of blocking oxygen, silver oxide (I) ($Ag_2O$), silver monoxide (AgO), aluminum oxide ($Al_2O_3$), aluminum fluoride ($AlF_3$), barium fluoride ($BaF_2$), cerium oxide (IV) ($CeO_2$), chromium oxide (III) ($Cr_2O_3$), chromium sulfide (III) ($Cr_2S_3$), gadolinium fluoride ($GdF_3$), hafnium oxide (IV) ($HfO_2$), indium tin oxide (ITO), lanthanum fluoride ($LaF_3$), lithium niobate ($LiNbO_3$), magnesium fluoride ($MgF_2$), magnesium oxide (MgO), sodium hexafluoroaluminate ($Na_3AlF_6$), niobium pentoxide ($Nb_2O_5$), nichrome (Ni—Cr), nitrides of nichrome ($NiCrN_x$), nitrogen oxides ($O_xN_y$), silicon nitride ($SiN_4$), silicon oxide (SiO), silicon dioxide ($SiO_2$), tantalum pentoxide ($Ta_2O_5$), titanium trioxide ($Ti_2O_3$), pentoxide titanium ($Ti_3O_5$), titanium oxide (TiO), titanium dioxide ($TiO_2$), tungsten oxide ($WO_3$), yttrium oxide ($Y_2O_3$). yttrium fluoride ($YF_3$), zinc sulfide (ZnS), zirconium dioxide ($ZrO_2$), indium oxide ($In_2O_3$), or the like. It goes without saying that another material may be used.

The protective layer 1508 may have a sufficient thickness for blocking oxygen, e.g., thickness of approximately 300 nm. Further, the protective layer 1508 preferably has high optical transparency. Further, by making the protective layer 1508 formed of a material that blocks oxygen and is physically or chemically strong, the protective layer 1508 may not only block oxygen but also prevent physical or chemical damage of the lower layer.

As shown in FIG. 8(b), the protective layer 1508 may be formed also on a side surface of the infrared absorption layer 1505 at the end portion (outer peripheral portion) of the image pickup device 1500. Accordingly, it is also possible to prevent oxygen from reaching the side surface of the infrared absorption layer 1505.

Fourth Embodiment

An image pickup device according to a fourth embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 9A:
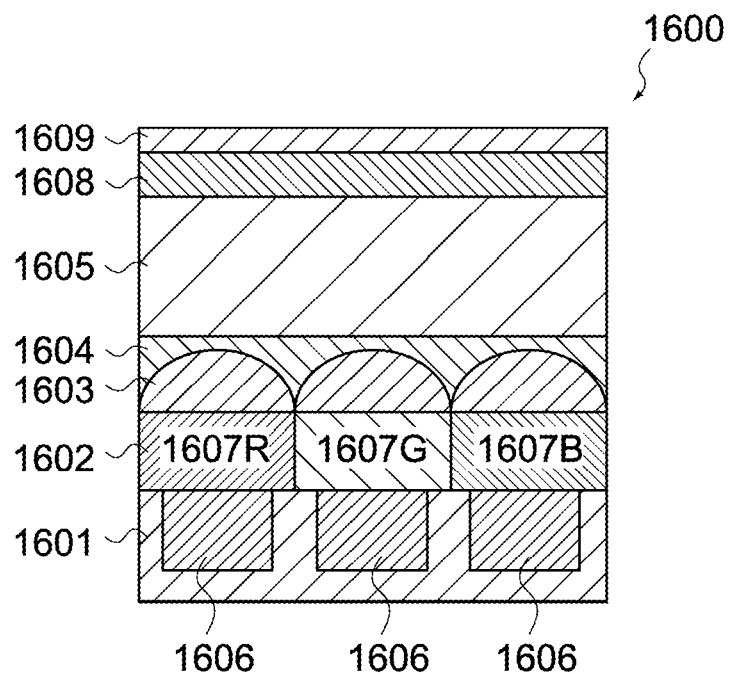
FIGS. 9(a) and 9(b) are schematic diagrams of an image pickup device according to a fourth embodiment of the present technology.
Figure 9B:
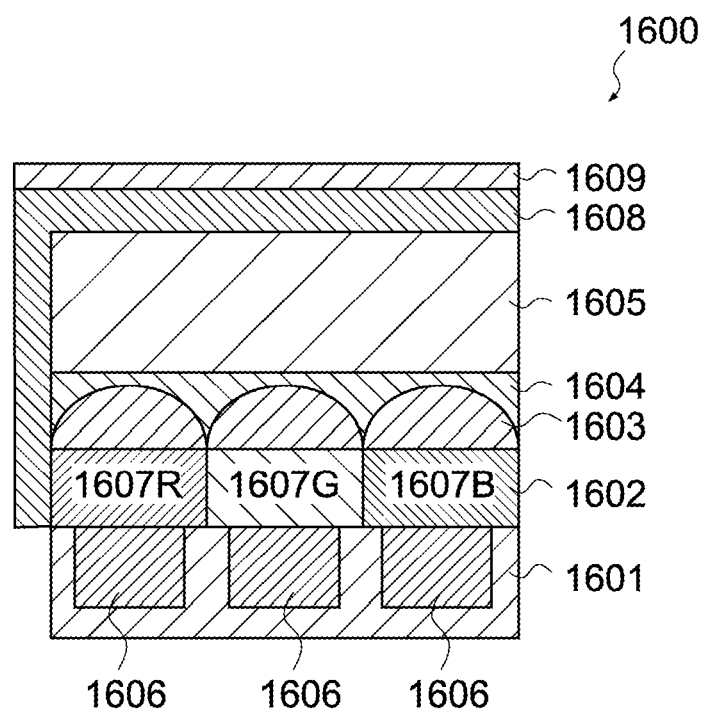

FIGS. 9(a) and 9(b) are schematic diagrams showing an image pickup device 1600 according to this embodiment. FIG. 9(a) shows the central portion of the image pickup device 1600, and FIG. 9(b) shows an end portion (outer peripheral portion) of the image pickup device 1500. As shown in FIG. 9(a), the image pickup device 1600 is configured by laminating a photoelectric conversion layer 1601, a color filter layer 1602, on-chip lenses 1603, a low-refractive index layer 1604, an infrared absorption layer 1605, a protective layer 1608, and an antireflection layer 1609.

The photoelectric conversion layer 1601, the color filter layer 1602, the on-chip lens 1603, the low-refractive index layer 1604, and the infrared absorption layer 1605 may have configurations similar to those in the first embodiment. In the photoelectric conversion layer 1601, a plurality of photoelectric conversion devices 1606. The color filter layer 1602 includes a red color filter 1607R, a green color filter 1607G, and a blue color filter 1607B (hereinafter, collectively referred to as the color filter 1607) corresponding to the respective photoelectric conversion devices 1606.

The protective layer 1608 is laminated on the infrared absorption layer 1605, and blocks oxygen and water or suppresses physical damage. By the protective layer 1608 blocking oxygen, oxygen is prevented from reaching the infrared absorption layer 1605, and the infrared absorption dye contained in the infrared absorption layer 1605 is prevented from being oxidized.

The protective layer 1608 can be formed of a material capable of blocking oxygen, silver oxide (I) ($Ag_2O$), silver monoxide (AgO), aluminum oxide ($Al_2O_3$), aluminum fluoride ($AlF_3$), barium fluoride ($BaF_2$), cerium oxide (IV) ($CeO_2$), chromium oxide (III) ($Cr_2O_3$), chromium sulfide (III) ($Cr_2S_3$), gadolinium fluoride ($GdF_3$), hafnium oxide (IV) ($HfO_2$). indium tin oxide (ITO), lanthanum fluoride ($LaF_3$), lithium niobate ($LiNbO_3$), magnesium fluoride ($MgF_2$), magnesium oxide (MgO), sodium hexafluoroaluminate ($Na_3AlF_6$), niobium pentoxide ($Nb_2O_5$), nichrome (Ni—Cr), nitrides of nichrome ($NiCrN_x$), nitrogen oxides ($O_xN_y$), silicon nitride ($SiN_4$), silicon oxide (SiO), silicon dioxide ($SiO_2$), tantalum pentoxide ($Ta_2O_5$), titanium trioxide ($Ti_2O_3$), pentoxide titanium ($Ti_3O_5$), titanium oxide (TiO), titanium dioxide ($TiO_2$), tungsten oxide ($WO_3$). yttrium oxide ($Y_2O_3$). yttrium fluoride ($YF_3$), zinc sulfide (ZnS), zirconium dioxide ($ZrO_2$), indium oxide ($In_2O_3$), or the like. It goes without saying that another material may be used.

The protective layer 1608 may have a sufficient thickness for blocking oxygen, e.g., thickness of approximately 300 nm. Further, the protective layer 1608 preferably has high optical transparency.

As shown in FIG. 9(b), the protective layer 1608 may be formed also on a side surface of the infrared absorption layer 1605 at the end portion (outer peripheral portion) of the image pickup device 1600. Accordingly, it is also possible to prevent oxygen from reaching the side surface of the infrared absorption layer 1605.

The antireflection layer 1609 is laminated as the uppermost layer of the image pickup device 1600 on the protective layer 1608, and prevents reflection of incident light from the upper side and incident light from the lower layer (infrared absorption layer 1605). The antireflection layer 1609 may be formed of an arbitrary material that reduces the light reflectance on the interface between the air and the infrared absorption layer 1605. Further, by making the antireflection layer 1609 formed of a material that is physically or chemically strong, it is also possible to prevent physical or chemical damage of the lower layer.

Fifth Embodiment

An image pickup device according to a fifth embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 10:
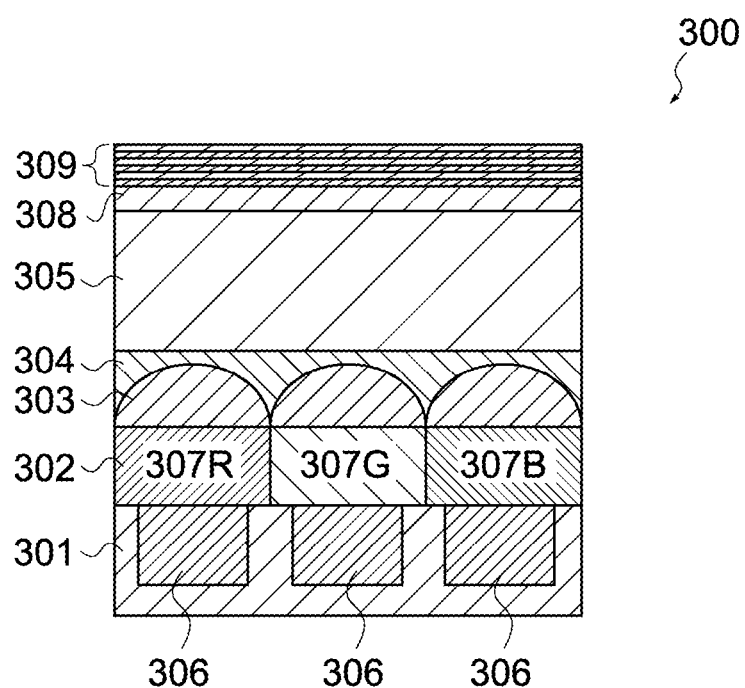
FIG. 10 is a schematic diagram of an image pickup device according to a fifth embodiment of the present technology.

FIG. 10 is a schematic diagram showing an image pickup device 300 according to this embodiment. As shown in the figure, the image pickup device 300 is configured by laminating a photoelectric conversion layer 301, a color filter layer 302, on-chip lenses 303, a low-refractive index layer 304, an infrared absorption layer 305, a protective layer 308, and a band-pass layer 309.

The photoelectric conversion layer 301, the color filter layer 302, the on-chip lens 303, the low-refractive index layer 304, and the infrared absorption layer 305 may have configurations similar to those in the first embodiment. In the photoelectric conversion layer 301, a plurality of photoelectric conversion devices 306 are formed. The color filter layer 302 includes a red color filter 307R, a green color filter 307G, and a blue color filter 307B (hereinafter, collectively referred to as the color filter 307) corresponding to the respective photoelectric conversion devices 306.

The protective layer 308 is laminated on the infrared absorption layer 305, and blocks oxygen and water or suppresses physical damage. Accordingly, as shown in FIG. 10, it is possible to laminate the band-pass layer 309 on the infrared absorption layer 305 via the protective layer 308. Note that it does not need to provide the protective layer 308 depending on the method of laminating the band-pass layer 309.

The protective layer 308 can be formed of a material capable of blocking oxygen, silver oxide (I) ($Ag_2O$), silver monoxide (AgO), aluminum oxide ($Al_2O_3$), aluminum fluoride ($AlF_3$), barium fluoride ($BaF_2$), cerium oxide (IV) ($CeO_2$), chromium oxide (III) ($Cr_2O_3$), chromium sulfide (III) ($Cr_2S_3$), gadolinium fluoride ($GdF_3$), hafnium oxide (IV) ($HfO_2$). indium tin oxide (ITO), lanthanum fluoride ($LaF_3$), lithium niobate ($LiNbO_3$), magnesium fluoride ($MgF_2$), magnesium oxide (MgO), sodium hexafluoroaluminate ($Na_3AlF_6$), niobium pentoxide ($Nb_2O_5$), nichrome (Ni—Cr), nitrides of nichrome ($NiCrN_x$), nitrogen oxides ($O_xN_y$), silicon nitride ($SiN_4$), silicon oxide (SiO), silicon dioxide ($SiO_2$), tantalum pentoxide ($Ta_2O_5$), titanium trioxide ($Ti_2O_3$), pentoxide titanium ($Ti_3O_5$), titanium oxide (TiO), titanium dioxide ($TiO_2$), tungsten oxide ($WO_3$). yttrium oxide ($Y_2O_3$). yttrium fluoride ($YF_3$), zinc sulfide (ZnS), zirconium dioxide ($ZrO_2$), indium oxide ($In_2O_3$), or the like. It goes without saying that another material may be used.

The band-pass layer 309 is laminated on the protective layer 308, and removes a part or all of violet light contained in incident light, and light having a shorter wavelength than the violet light or infrared light, or both of them. The band-pass layer 309 may be obtained by alternately laminating a layer formed of a high-refractive index material and a layer formed of a low-refractive index layer, reflect a part or all of violet light, and light having a shorter wavelength than the violet light or infrared light, or both of them by interference of light between these layers, and cause visible light to be transmitted therethrough.

The image pickup device 300 includes the infrared absorption layer 305 in addition to the band-pass layer 309, and both of the layers make it possible to prevent the infrared component from reaching the photoelectric conversion device 306 in this embodiment. Further, with the band-pass layer 309, it is also possible to remove a part or all of violet light, and light having a shorter wavelength than the violet light.

Figure 11:
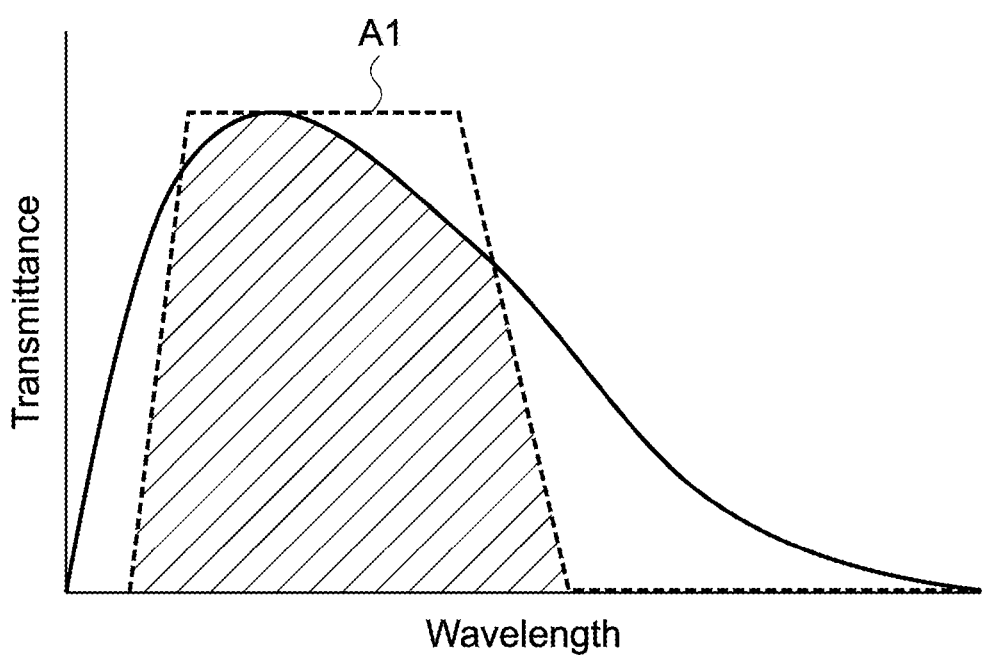
FIG. 11 is a graph showing transmission spectral characteristics of the image pickup device by the infrared absorption layer.

FIGS. 11 to 13 are each a graph showing transmission spectral characteristics by the band-pass layer 309 and the infrared absorption layer 305. FIG. 11 shows a transmission wavelength band A1 of only the infrared absorption layer 305 and spectral sensitivity characteristics of the photoelectric conversion device 306, representing that light in the transmission wavelength band of the infrared absorption layer 305 (shaded area in the figure) is not absorbed by the infrared absorption layer 305 and detected by the photoelectric conversion device 306.

Figure 12A:
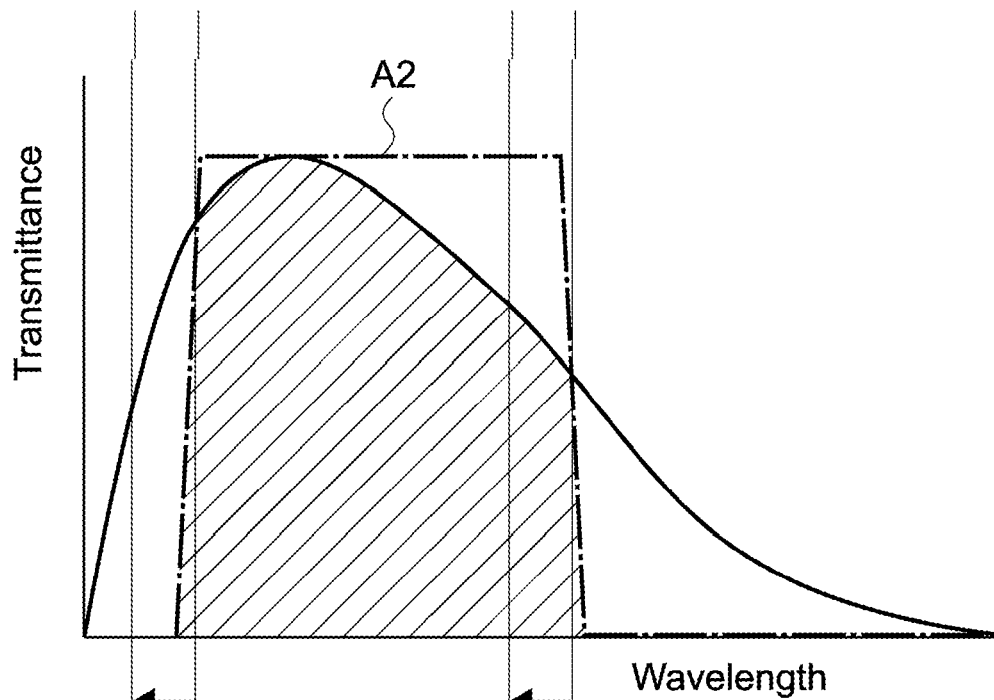
FIGS. 12(a) and 12(b) are graphs showing transmission spectral characteristics of the image pickup device by the band-pass layer.
Figure 12B:
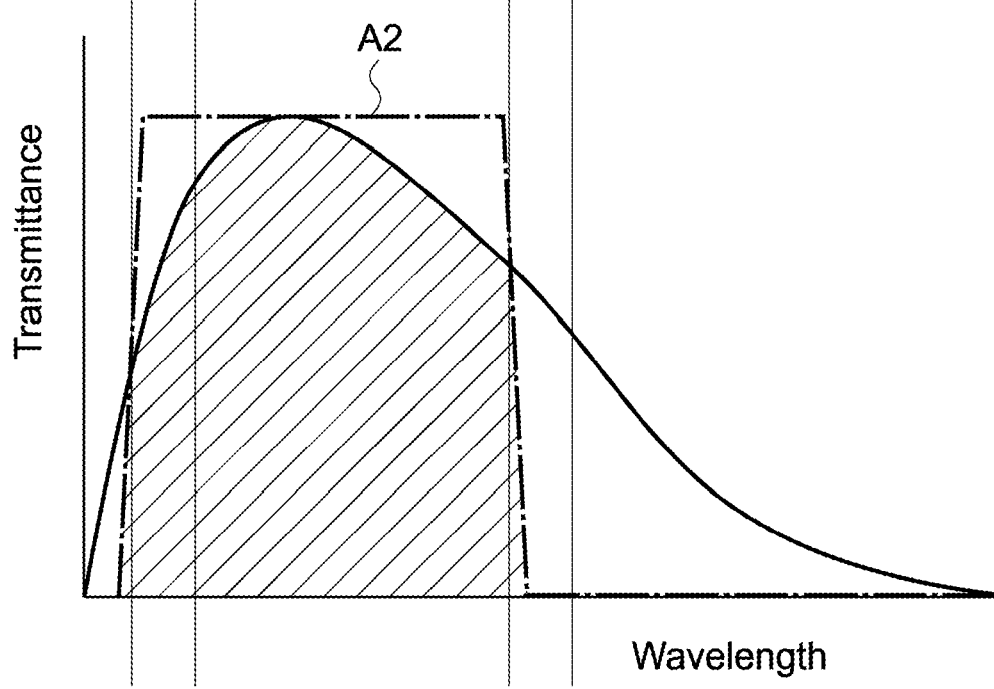

FIGS. 12(a) and 12(b) shows a transmission wavelength band A2 of only the band-pass layer 309 and spectral sensitivity characteristics of the photoelectric conversion device 306. FIG. 12(a) shows the case where the light incidence angle to the image pickup device 300 is 0° (direction vertical to the layer), and FIG. 12(b) shows the case where the incidence angle is 30° (30° from the direction vertical to the layer). As shown FIG. 12(a) and FIG. 12(b) in the band-pass layer 309, the transmission wavelength band A2 shifts to the shorter wavelength side depending on the light incidence angle. This is because the band-pass layer 309 uses interference of light by the multilayer film, and the optical path length changes depending on the incidence angle.

Therefore, in the case where the infrared component is removed only by the band-pass layer 309, the following problem occurs. In recent years, the focal length of the imaging lens tends to be shortened due to the thickness reduction of the imaging apparatus, and in the imaging lens having a short focal length, the incident angle around the angle of view (peripheral edge of the photoelectric conversion layer 301) becomes larger than the incident angle at the center of the angle of view (center of the photoelectric conversion layer 301) because also the exit pupil distance is shortened. Therefore, the transmission wavelength by the band-pass layer 309 is different depending on the position of the photoelectric conversion layer 301 in the photoelectric conversion device 306, and in-plane uniformity is deteriorated, i.e., color reproducibility differs depending on the position of the captured image.

Figure 13A:
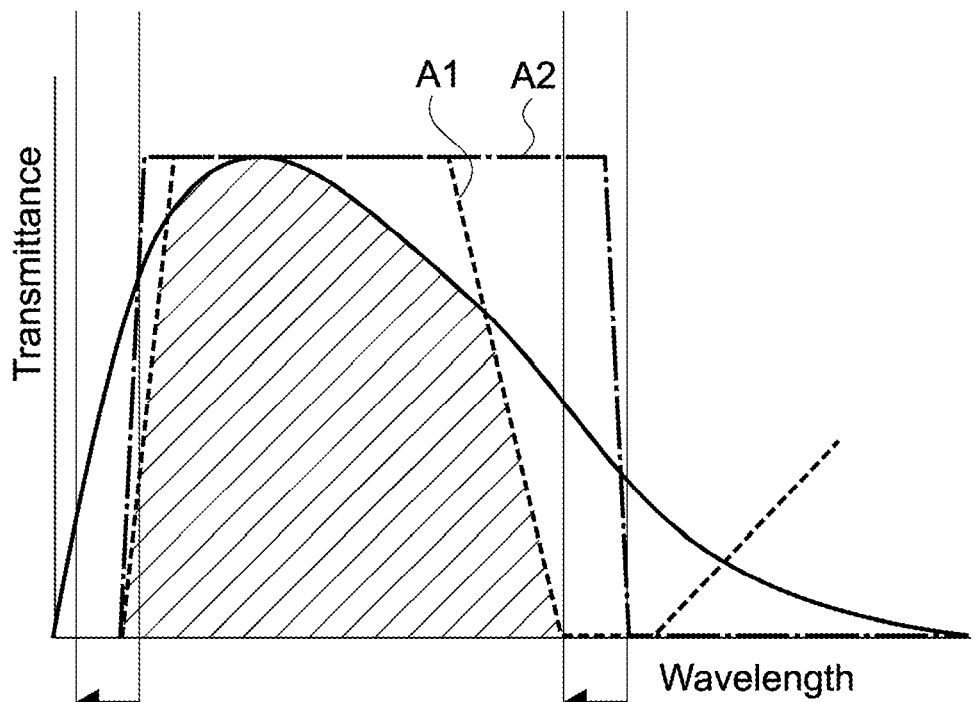
FIGS. 13(a) and 13(b) are graphs showing transmission spectral characteristics of the image pickup device by the infrared absorption layer and the band-pass layer.
Figure 13B:
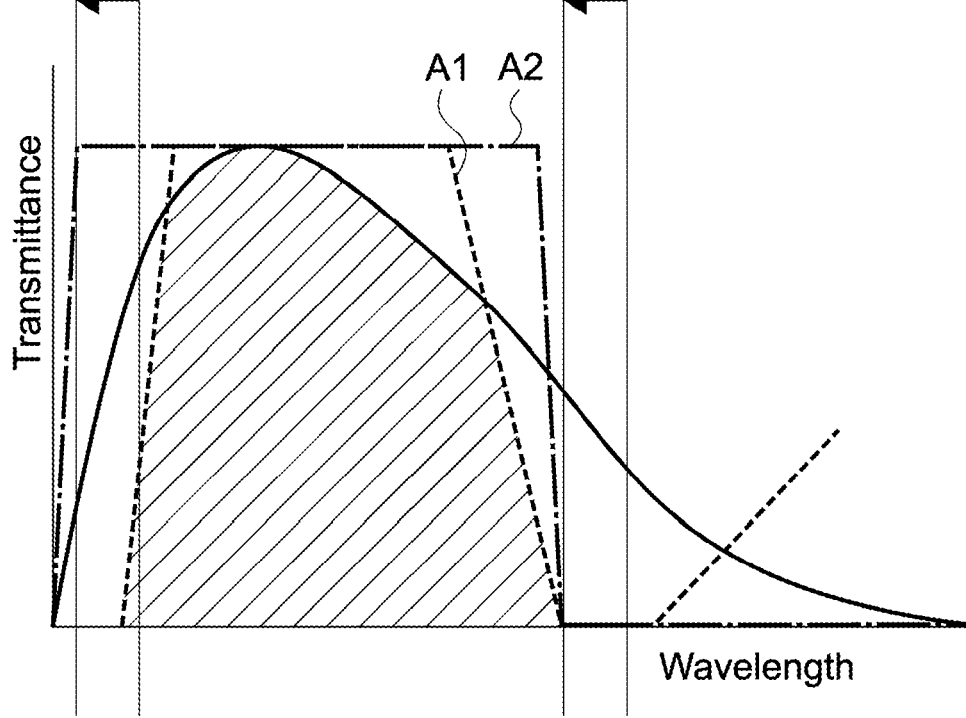

Meanwhile, FIGS. 13(a) and 13(b) shows the transmission wavelength band A1 (A1 has a transmittance on the longer wavelength side in some cases) of the infrared absorption layer 305, the transmission wavelength band A2 of the band-pass layer 309, and spectral characteristics of the photoelectric conversion device 306. FIG. 13(a) shows the case where the light incidence angle to the image pickup device 300 is 0° (direction vertical to the layer), and FIG. 13(b) shows the case where the incidence angle is 30° (30° from the direction vertical to the layer). As shown in FIG. 13(a) and FIG. 13(b), even in the case where the transmission wavelength band A2 of the band-pass layer 309 shifts due to the difference in the light incidence angle to the image pickup device 300, it is possible to maintain the transmission wavelength band by the transmission wavelength band A1 of the infrared absorption layer 305.

As described above, the image pickup device 300 according to this embodiment is capable of preventing fluctuation of the transmission wavelength band due to the difference in the light incidence angle by using the band-pass layer 309 and the infrared absorption layer 305 in combination. Further, since a predetermined amount of infrared component can be removed by the band-pass layer 309, it is also possible to reduce the thickness of the infrared absorption layer 305.

Sixth Embodiment

An image pickup device according to a sixth embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 14:
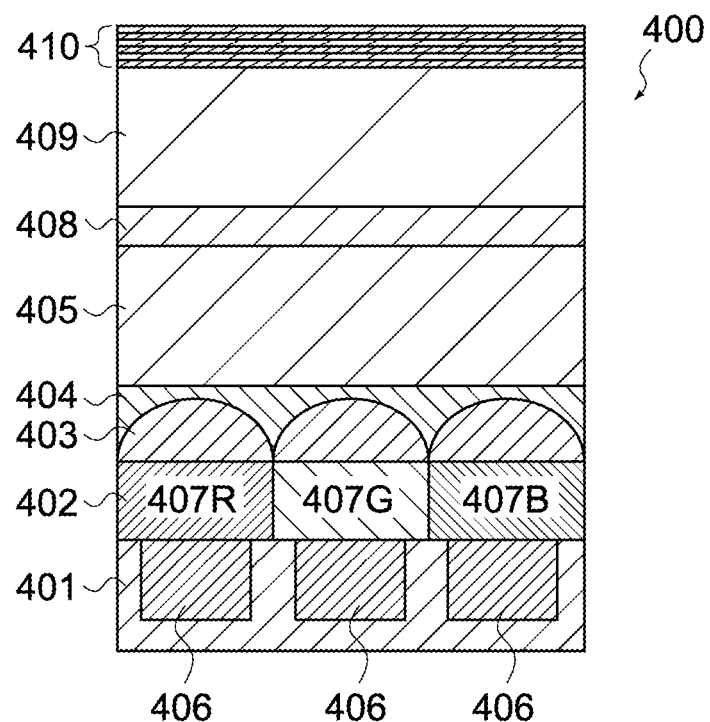
FIG. 14 is a schematic diagram of an image pickup device according to a sixth embodiment of the present technology.

FIG. 14 is a schematic diagram showing an image pickup device 400 according to this embodiment. As shown in the figure, the image pickup device 400 is configured by laminating a photoelectric conversion layer 401, a color filter layer 402, on-chip lenses 403, a low-refractive index layer 404, an infrared absorption layer 405, an adhesive layer 408, a supporting substrate 409, and a band-pass layer 410.

The photoelectric conversion layer 401, the color filter layer 402, the on-chip lenses 403, the low-refractive index layer 404, and the infrared absorption layer 405 may have configurations similar to those in the first embodiment. In the photoelectric conversion layer 401, a plurality of photoelectric conversion devices 406 are formed. The color filter layer 402 includes a red color filter 407R, a green color filter 407G, and a blue color filter 407B (hereinafter, collectively referred to as the color filter 407) corresponding to the respective photoelectric conversion devices 406.

The adhesive layer 408 is laminated on the infrared absorption layer 405, and adheres the infrared absorption layer 405 and the supporting substrate 409. The adhesive layer 408 may be formed of an arbitrary material having adhesiveness, e.g., synthetic resin, and preferably has high optical transparency. Further, the adhesive layer 408 may further have infrared absorption capacity. In this case, the adhesive layer 408 may contain the above-mentioned infrared absorption material (infrared absorption material described in the description of the infrared absorption layer 105).

The supporting substrate 409 is laminated on the adhesive layer 408, and supports the band-pass layer 410. The supporting substrate 409 may be a plate-like member having a certain degree of strength, and may be formed of a material having high optical transparency, e.g., glass.

The band-pass layer 410 is laminated on the supporting substrate 409, and removes a part or all of violet light, and light having a shorter wavelength than the violet light or infrared light, or both of them. The band-pass layer 410 may have a structure in which a high-refractive index material and a low-refractive index material are alternately laminated similarly to the fifth embodiment.

With such a configuration, the image pickup device 400 can be prepared by separately preparing those obtained by depositing the band-pass layer 410 on the supporting substrate 409, and a laminate body from the photoelectric conversion layer 401 to the infrared absorption layer 405, and adhering both of them by the adhesive layer 408. Since a general manufacturing apparatus for an image pickup device does not have a function of depositing a multilayer film in many cases, it is difficult to prepare an image pickup device having a multilayer film by using a general manufacturing apparatus for an image pickup device.

Here, with the configuration of the image pickup device 400 according to this embodiment, preparation of the band-pass layer 410 and preparation of the laminated body of the lower layer (from the photoelectric conversion layer 401 to the infrared absorption layer 405) can be performed by different processes. Accordingly, it is possible to manufacture the image pickup device 400 by using the existing manufacturing apparatus and the multilayer film deposition apparatus without newly introducing or significantly remodeling the manufacturing apparatus.

Seventh Embodiment

An image pickup device according to a seventh embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 15:
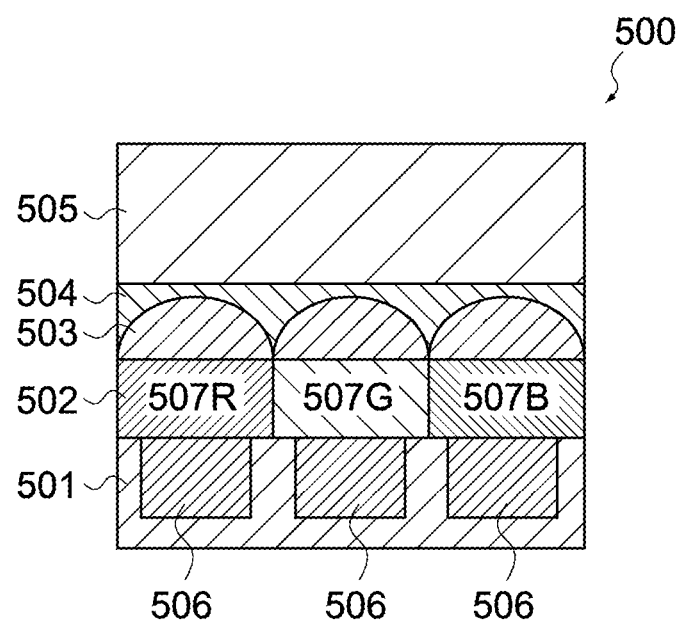
FIG. 15 is a schematic diagram of an image pickup device according to a seventh embodiment of the present technology.

FIG. 15 is a schematic diagram showing an image pickup device 500 according to this embodiment. As shown in the figure, the image pickup device 500 is configured by laminating a photoelectric conversion layer 501, a color filter/infrared absorption layer 502, on-chip lenses 503, a low-refractive index layer 504, and an infrared absorption layer 505.

The photoelectric conversion layer 501, the on-chip lens 503, the low-refractive index layer 504, and the infrared absorption layer 505 may have configurations similar to those in the first embodiment. In the photoelectric conversion layer 501, a plurality of photoelectric conversion devices 506 are formed.

The color filter/infrared absorption layer 502 is laminated on the photoelectric conversion layer 501, and has infrared absorption capacity in addition to a function of a color filter. Specifically, the color filter/infrared absorption layer 502 may be obtained by mixing the infrared absorption dye described in the first embodiment in color filters of colors corresponding to the respective photoelectric conversion devices 506. As shown in FIG. 15, the color filter/infrared absorption layer 502 may include a red color filter/infrared absorber 507R, a green color filter/infrared absorber 507G, and a blue color filter/infrared absorber 507B, and these are collectively referred to as the color filter/infrared absorber 507 hereinafter. Note that the transmission color of the color filter/infrared absorber 507 is not limited to the above-mentioned three colors.

The image pickup device 500 is capable of removing the infrared component of incident light not only by the infrared absorption layer 505 but also by the color filter/infrared absorption layer 502. Accordingly, it is possible to reduce the thicknesses of them as compared with the case where only one of them is provided.

In the case where only the color filter/infrared absorption layer 32 is responsible for the removal of the infrared component as in the image pickup device 30 according to the above-mentioned comparative example (see FIG. 5), the thickness thereof cannot avoid increasing, and such a problem that incident light enters another photoelectric conversion device occurs. Meanwhile, in the image pickup device 500 according to this embodiment, it does not need to increase the thickness of the color filter/infrared absorption layer 502, and the problem that incident light enters another photoelectric conversion device does not occur. In addition, the image pickup device 500 is capable of sufficiently removing the infrared component of incident light by two infrared absorption layers of the infrared absorption layer 505 and the color filter/infrared absorption layer 502.

Eighth Embodiment

An image pickup device according to an eighth embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 16:
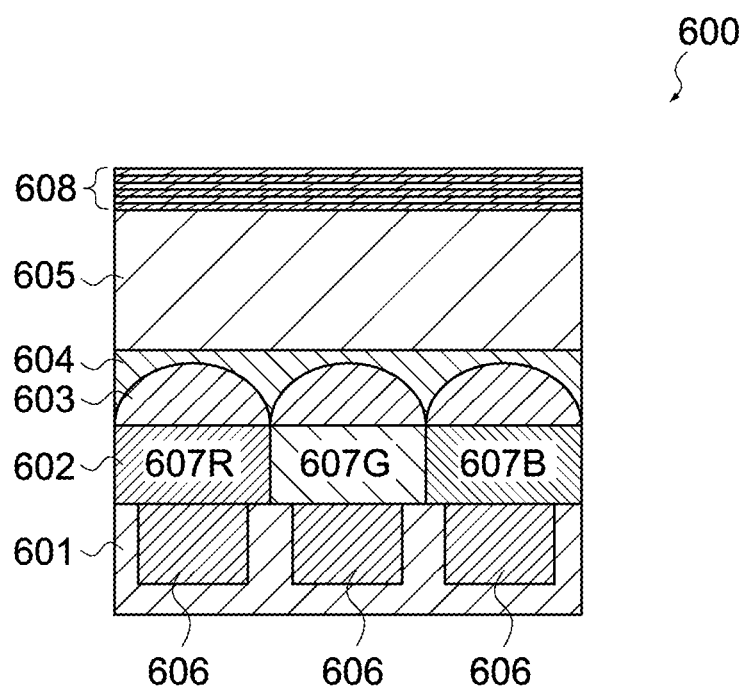
FIG. 16 is a schematic diagram of an image pickup device according to an eighth embodiment of the present technology.

FIG. 16 is a schematic diagram showing an image pickup device 600 according to this embodiment. As shown in the figure, the image pickup device 600 is configured by laminating a photoelectric conversion layer 601, a color filter layer 602, on-chip lenses 603, a low-refractive index layer 604, an infrared absorption layer 605, and a band-pass layer 608.

The photoelectric conversion layer 601, the color filter layer 602, the on-chip lens 603, the low-refractive index layer 604, and the infrared absorption layer 605 may have configurations similar to those in the first embodiment. In the photoelectric conversion layer 601, a plurality of photoelectric conversion devices 606 are formed. The color filter layer 602 includes a red color filter 607R, a green color filter 607G, and a blue color filter 607B (hereinafter, collectively referred to as the color filter 607) corresponding to the respective photoelectric conversion devices 606.

The band-pass layer 608 has a configuration similar to that in the fifth embodiment, and is laminated on the infrared absorption layer 605. The image pickup device 600 according to this embodiment is capable of removing the infrared component in incident light by both of the infrared absorption layer 605 and the band-pass layer 608. Further, the band-pass layer 608 is also capable of removing a part or all of violet light, and light having a shorter wavelength than the violet light.

Ninth Embodiment

An image pickup device according to a ninth embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 17:
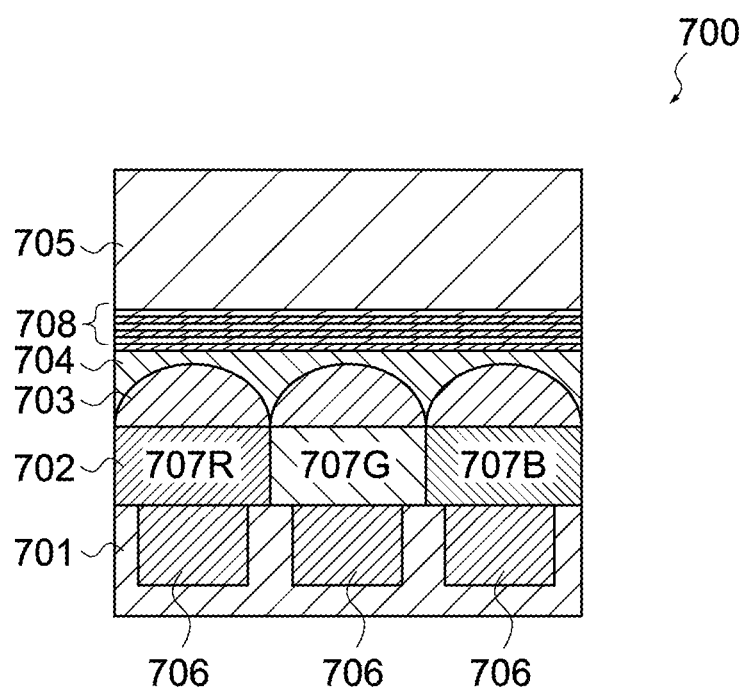
FIG. 17 is a schematic diagram of an image pickup device according to a ninth embodiment of the present technology.

FIG. 17 is a schematic diagram showing an image pickup device 700 according to this embodiment. As shown in the figure, the image pickup device 700 is configured by laminating a photoelectric conversion layer 701, a color filter layer 702, on-chip lenses 703, a low-refractive index layer 704, a band-pass layer 708, and an infrared absorption layer 705.

The photoelectric conversion layer 701, the color filter layer 702, the on-chip lenses 703, the low-refractive index layer 704, and the infrared absorption layer 705 may have configurations similar to those in the first embodiment. In the photoelectric conversion layer 701, a plurality of photoelectric conversion devices 706 are formed. The color filter layer 702 includes a red color filter 707R, a green color filter 707G, and a blue color filter 707B (hereinafter, collectively referred to as the color filter 707) corresponding to the respective photoelectric conversion device 706.

The band-pass layer 708 has a configuration similar to that in the fifth embodiment, and is laminated on the low-refractive index layer 704. Also with such a configuration, it is possible to remove the infrared component in incident light by both of the infrared absorption layer 705 and the band-pass layer 708. Further, the band-pass layer 708 is also capable of removing a part or all of violet light, and light having a shorter wavelength than the violet light.

Tenth Embodiment

An image pickup device according to a tenth embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 18:
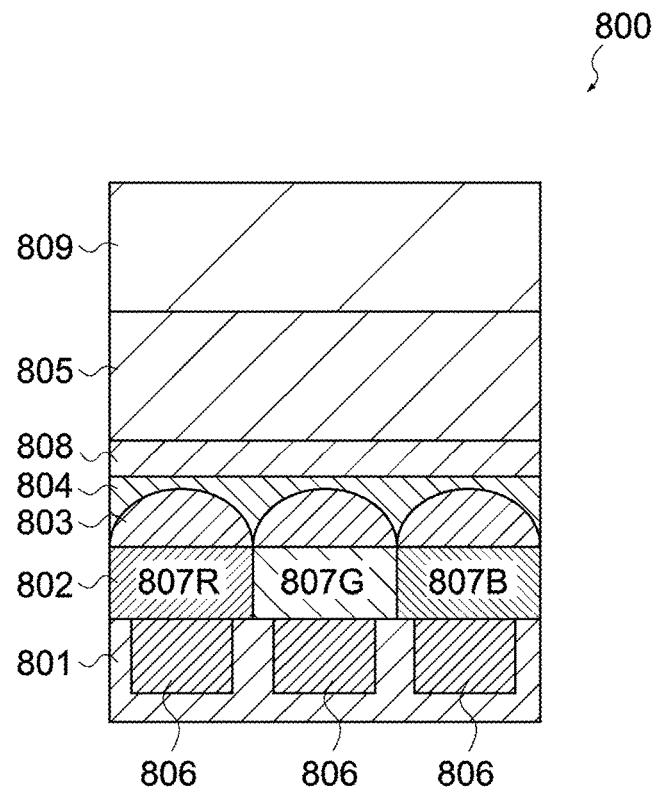
FIG. 18 is a schematic diagram of an image pickup device according to a tenth embodiment of the present technology.

FIG. 18 is a schematic diagram showing an image pickup device 800 according to this embodiment. As shown in the figure, the image pickup device 800 is configured by laminating a photoelectric conversion layer 801, a color filter layer 802, on-chip lenses 803, a low-refractive index layer 804, an adhesive layer 808, an infrared absorption layer 805, and a supporting substrate 809.

The photoelectric conversion layer 801, the color filter layer 802, the on-chip lenses 803, and the low-refractive index layer 804 may have configurations similar to those in the first embodiment. In the photoelectric conversion layer 801, a plurality of photoelectric conversion devices 806 are formed. The color filter layer 802 includes a red color filter 807R, a green color filter 807G, and a blue color filter 807B (hereinafter, collectively referred to as the color filter 807) corresponding to the respective photoelectric conversion devices 806.

The adhesive layer 808 is laminated on the low-refractive index layer 804, and adheres the infrared absorption layer 805 to the low-refractive index layer 804. The adhesive layer 808 may be formed of an arbitrary material having adhesiveness, e.g., synthetic resin, and preferably has high optical transparency. Further, the adhesive layer 808 may further have infrared absorption capacity. In this case, the adhesive layer 808 may contain the above-mentioned infrared absorption material (infrared absorption material described in the description of the infrared absorption layer 105).

The supporting substrate 809 supports the infrared absorption layer 805. The supporting substrate 809 may be a plate-like member having a certain degree of strength, and may be formed of a material having high optical transparency, e.g., glass.

The infrared absorption layer 805 may have a configuration similar to that in the first embodiment. Here, in this embodiment, the infrared absorption layer 805 may be laminated on the supporting substrate 809 in the process of manufacturing the image pickup device 800, and adhered to the lower layer structure (from the photoelectric conversion layer 801 to the low-refractive index layer 804) by the adhesive layer 808 together with the supporting substrate 809. Accordingly, it is possible to prepare the lower layer structure of the image pickup device and the infrared absorption layer 805 by different manufacturing processes (manufacturing apparatuses).

Eleventh Embodiment

An image pickup device according to an eleventh embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 19:
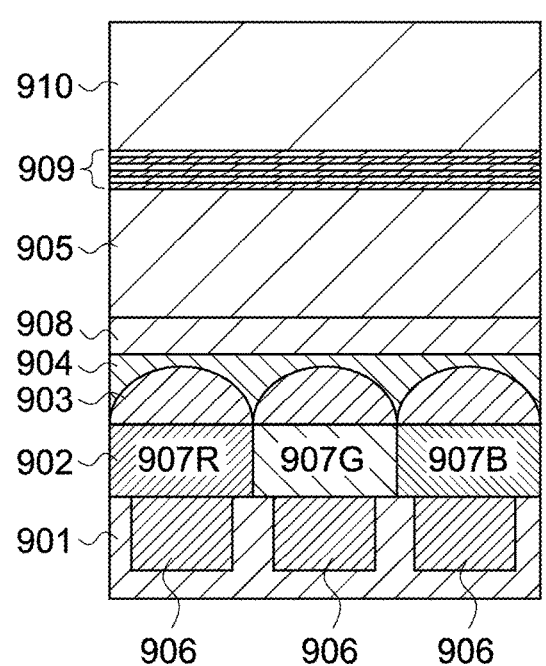
FIG. 19 is a schematic diagram of an image pickup device according to an eleventh embodiment of the present technology.

FIG. 19 is a schematic diagram showing an image pickup device 900 according to this embodiment. As shown in the figure, the image pickup device 900 is configured by laminating a photoelectric conversion layer 901, a color filter layer 902, on-chip lenses 903, a low-refractive index layer 904, an adhesive layer 908, an infrared absorption layer 905, a band-pass layer 909, and a supporting substrate 910.

The photoelectric conversion layer 901, the color filter layer 902, the on-chip lens 903, and the low-refractive index layer 904 may have configurations similar to those in the first embodiment. In the photoelectric conversion layer 901, a plurality of photoelectric conversion devices 906 are formed. The color filter layer 902 includes a red color filter 907R, a green color filter 907G, and a blue color filter 907B (hereinafter, collectively referred to as the color filter 907) corresponding to the respective photoelectric conversion devices 906.

The adhesive layer 908 is laminated on the low-refractive index layer 904, and adheres the infrared absorption layer 905 to the low-refractive index layer 904. The adhesive layer 908 may be formed of an arbitrary material having adhesiveness, e.g., synthetic resin, and preferably has high optical transparency. Further, the adhesive layer 908 may further have infrared absorption capacity. In this case, the adhesive layer 908 may contain the above-mentioned infrared absorption material (infrared absorption material described in the description of the infrared absorption layer 105).

The band-pass layer 909 has a configuration similar to that in the fifth embodiment, and is laminated on the infrared absorption layer 905. Also with such a configuration, it is possible to remove the infrared component in incident light by the infrared absorption layer 905 and the band-pass layer 909. Further, the band-pass layer 909 is also capable of removing a part or all of violet light, and light having a shorter wavelength than the violet light.

The supporting substrate 910 supports the band-pass layer 909 and the infrared absorption layer 905. The supporting substrate 910 may be a plate-like member having a certain degree of strength, and may be formed of a material having high optical transparency, e.g., glass.

The band-pass layer 909 and the infrared absorption layer 905 may be laminated on the supporting substrate 910 in the process of manufacturing the image pickup device 900. Specifically, first, the band-pass layer 909 may be laminated on the supporting substrate 910, and the infrared absorption layer 905 may be laminated thereon.

In this embodiment, the laminated body in which the band-pass layer 909 and the infrared absorption layer 905 are laminated on the supporting substrate 910 may be adhered to the lower layer structure (from the photoelectric conversion layer 901 to the low-refractive index layer 904) by the adhesive layer 908. Accordingly, it is possible to prepare the lower layer structure of the image pickup device 900, and the band-pass layer 909 and the infrared absorption layer 905 by different manufacturing processes (manufacturing apparatuses).

Twelfth Embodiment

An image pickup device according to a twelfth embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 20:
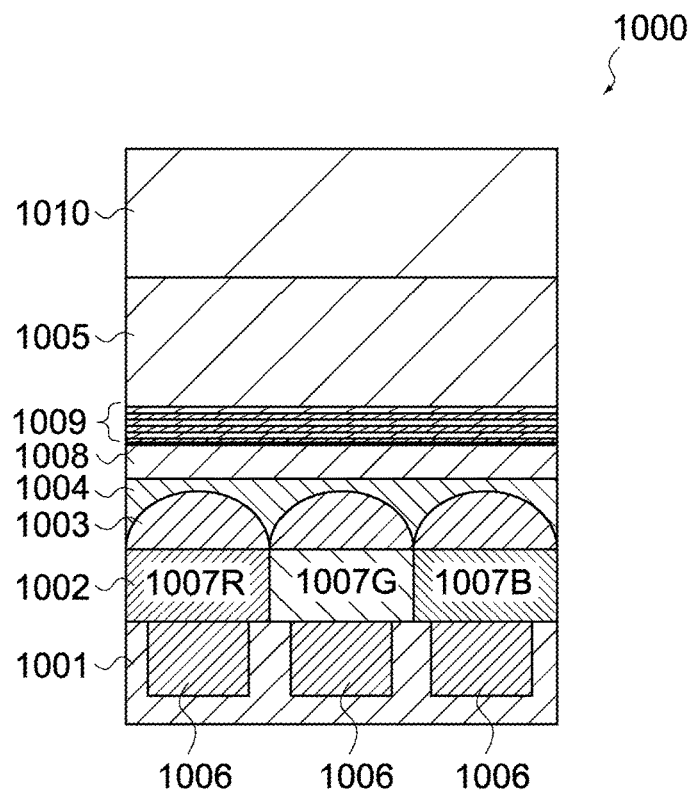
FIG. 20 is a schematic diagram of an image pickup device according to a twelfth embodiment of the present technology.

FIG. 20 is a schematic diagram showing an image pickup device 1000 according to this embodiment. As shown in the figure, the image pickup device 1000 is configured by laminating a photoelectric conversion layer 1001, a color filter layer 1002, on-chip lenses 1003, a low-refractive index layer 1004, an adhesive layer 1008, a band-pass layer 1009, an infrared absorption layer 1005, and a supporting substrate 1010.

The photoelectric conversion layer 1001, the color filter layer 1002, the on-chip lens 1003, and the low-refractive index layer 1004 may have configurations similar to those in the first embodiment. In the photoelectric conversion layer 1001, a plurality of photoelectric conversion devices 1006 are formed. The color filter layer 1002 includes a red color filter 1007R, a green color filter 1007G, and a blue color filter 1007B (hereinafter, collectively referred to as the color filter 1007) corresponding to the respective photoelectric conversion devices 1006.

The adhesive layer 1008 is laminated on the low-refractive index layer 1004, and adheres the band-pass layer 1009 to the low-refractive index layer 1004. The adhesive layer 1008 may be formed of an arbitrary material having adhesiveness, e.g., synthetic resin, and preferably has high optical transparency. Further, the adhesive layer 1008 may further have infrared absorption capacity. In this case, the adhesive layer 1008 may contain the above-mentioned infrared absorption material (infrared absorption material described in the description of the infrared absorption layer 105).

The band-pass layer 1009 has a configuration similar to that in the fifth embodiment, and is laminated on the adhesive layer 1008. Also with such a configuration, it is possible to remove the infrared component in incident light by the infrared absorption layer 1005 and the band-pass layer 1009. Further, the band-pass layer 1009 is also capable of removing a part or all of violet light, and light having a shorter wavelength than the violet light.

The supporting substrate 1010 supports the infrared absorption layer 1005 and the band-pass layer 1009. The supporting substrate 1010 may be a plate-like member having a certain degree of strength, and may be formed of a material having high optical transparency, e.g., glass.

The infrared absorption layer 1005 and the band-pass layer 1009 may be laminated on the supporting substrate 1010 in the process of manufacturing the image pickup device 1000. Specifically, first, the infrared absorption layer 1005 may be laminated on the supporting substrate 1010, and the band-pass layer 1009 may be laminated thereon.

In this embodiment, the laminated body in which the infrared absorption layer 1005 and the band-pass layer 1009 are laminated on the supporting substrate 1010 may be adhered to the lower layer structure (from the photoelectric conversion layer 1001 to the low-refractive index layer 1004) by the adhesive layer 1008. Accordingly, it is possible to prepare the lower layer structure of the image pickup device, and the infrared absorption layer 1005 and the band-pass layer 1009 by different manufacturing processes (manufacturing apparatuses).

Thirteenth Embodiment

An image pickup device according to a thirteenth embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 21:
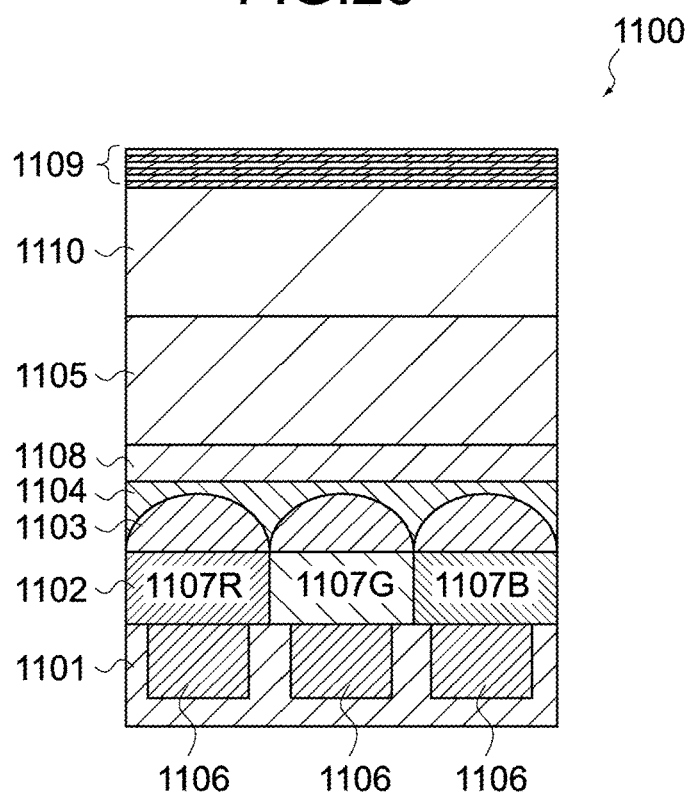
FIG. 21 is a schematic diagram of an image pickup device according to a thirteenth embodiment of the present technology.

FIG. 21 is a schematic diagram showing an image pickup device 1100 according to this embodiment. As shown in the figure, the image pickup device 1100 is configured by laminating a photoelectric conversion layer 1101, a color filter layer 1102, on-chip lenses 1103, a low-refractive index layer 1104, an adhesive layer 1108, an infrared absorption layer 1105, a supporting substrate 1110, and a band-pass layer 1109.

The photoelectric conversion layer 1101, the color filter layer 1102, the on-chip lens 1103, and the low-refractive index layer 1104 may have configurations similar to those in the first embodiment. In the photoelectric conversion layer 1101, a plurality of photoelectric conversion devices 1106 are formed. The color filter layer 1102 includes a red color filter 1107R, a green color filter 1107G, and a blue color filter 1107B (hereinafter, collectively referred to as the color filter 1107) corresponding to the respective photoelectric conversion devices 1106.

The adhesive layer 1108 is laminated on the low-refractive index layer 1104, and adheres the infrared absorption layer 1105 to the low-refractive index layer 1104. The adhesive layer 1108 may be formed of an arbitrary material having adhesiveness, e.g., synthetic resin, and preferably has high optical transparency. Further, the adhesive layer 1108 may further have infrared absorption capacity. In this case, the adhesive layer 1108 may contain the above-mentioned infrared absorption material (infrared absorption material described in the description of the infrared absorption layer 105).

The band-pass layer 1109 has a configuration similar to that in the fifth embodiment, and is laminated on the supporting substrate 1110. Also with such a configuration, it is possible to remove the infrared component in incident light by the infrared absorption layer 1105 and the band-pass layer 1109. Further, the band-pass layer 1109 is also capable of removing a part or all of violet light, and light having a shorter wavelength than the violet light.

The supporting substrate 1110 supports the infrared absorption layer 1105 and the band-pass layer 1109. The supporting substrate 1110 may be a plate-like member having a certain degree of strength, and may be formed of a material having high optical transparency, e.g., glass.

The infrared absorption layer 1105 and the band-pass layer 1109 may be laminated on the supporting substrate 1110 in the process of manufacturing the image pickup device 1100. Specifically, first, the infrared absorption layer 1105 may be laminated on one surface of the supporting substrate 1110, and the band-pass layer 1109 may be laminated on the other surface of the supporting substrate 1110.

In this embodiment, the laminated body in which the infrared absorption layer 1105 and the band-pass layer 1109 are laminated on the supporting substrate 1110 may be adhered to the lower layer structure (from the photoelectric conversion device 1101 to the low-refractive index layer 1104) by the adhesive layer 1108. Accordingly, it is possible to prepare the lower layer structure of the image pickup device 1100, and the infrared absorption layer 1105 and the band-pass layer 1109 by different manufacturing processes (manufacturing apparatuses).

Fourteenth Embodiment

An image pickup device according to a fourteenth embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 22:
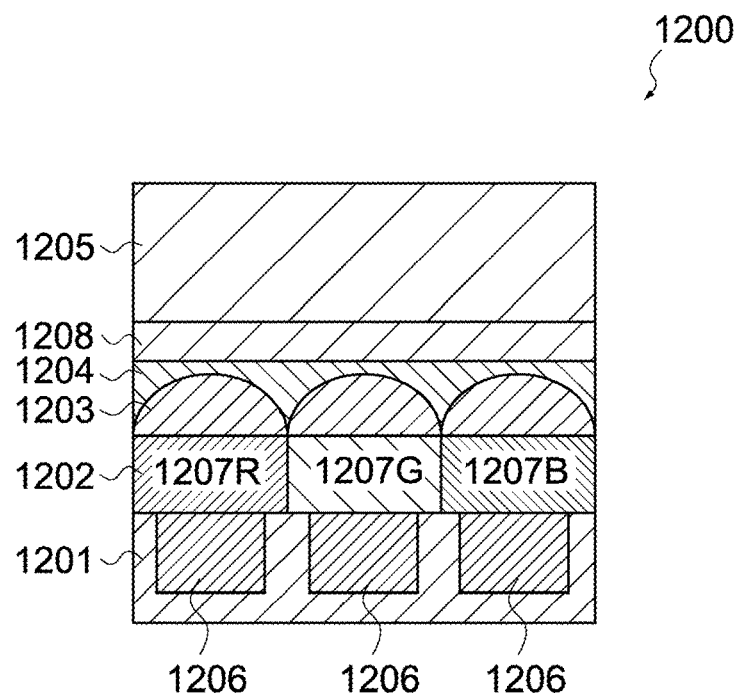
FIG. 22 is a schematic diagram of an image pickup device according to a fourteenth embodiment of the present technology.

FIG. 22 is a schematic diagram showing an image pickup device 1200 according to this embodiment. As shown in the figure, the image pickup device 1200 is configured by laminating a photoelectric conversion layer 1201, a color filter layer 1202, on-chip lenses 1203, a low-refractive index layer 1204, an adhesive layer 1208, and an infrared absorption layer 1205.

The photoelectric conversion layer 1201, the color filter layer 1202, the on-chip lens 1203, and the low-refractive index layer 1204 may have configurations similar to those in the first embodiment. In the photoelectric conversion layer 1201, a plurality of photoelectric conversion devices 1206 are formed. The color filter layer 1202 includes a red color filter 1207R, a green color filter 1207G, and a blue color filter 1207B (hereinafter, collectively referred to as the color filter 1207) corresponding to the respective photoelectric conversion devices 1206.

The adhesive layer 1208 is laminated on the low-refractive index layer 1204, and adheres the infrared absorption layer 1205 to the low-refractive index layer 1204. The adhesive layer 1208 may be formed of an arbitrary material having adhesiveness, e.g., synthetic resin, and preferably has high optical transparency. Further, the adhesive layer 1208 may further have infrared absorption capacity. In this case, the adhesive layer 1208 may contain the above-mentioned infrared absorption material (infrared absorption material described in the description of the infrared absorption layer 105).

The infrared absorption layer 1205 may be laminated on a supporting substrate (not shown) in the process of manufacturing the image pickup device 1200. The laminated body in which the infrared absorption layer 1205 is laminated on the supporting substrate may be adhered to the lower layer structure (from the photoelectric conversion device 1201 to the low-refractive index layer 1204) by the adhesive layer 1208. By removing the supporting substrate after the adhesion, it is possible to prepare the image pickup device 1200.

In this embodiment, by removing the supporting substrate that has supported the infrared absorption layer 1205, it is possible to prepare the lower layer structure of the infrared absorption layer 1205 and the infrared absorption layer 1205 by different manufacturing processes (manufacturing apparatuses), even with a structure having no supporting substrate.

Fifteenth Embodiment

An image pickup device according to a fifteenth embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 23:
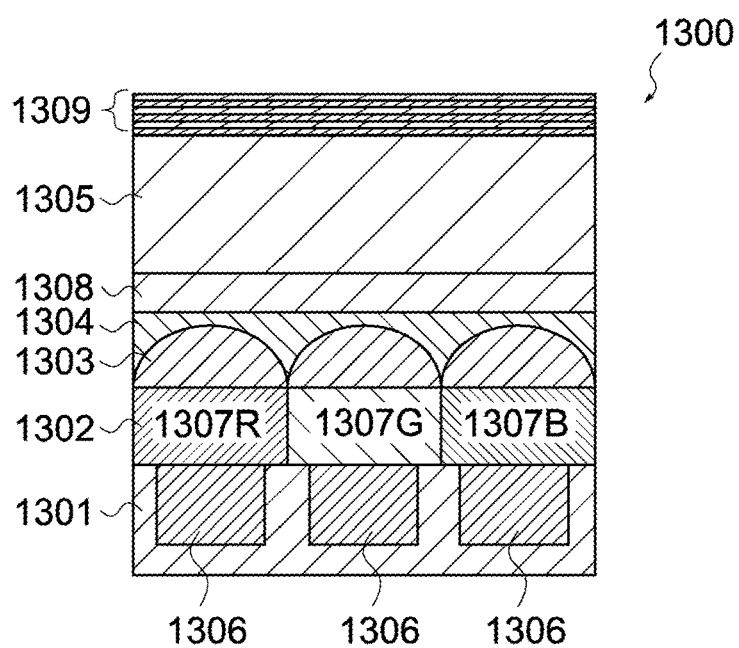
FIG. 23 is a schematic diagram of an image pickup device according to a fifteenth embodiment of the present technology.

FIG. 23 is a schematic diagram showing an image pickup device 1300 according to this embodiment. As shown in the figure, the image pickup device 1300 is configured by laminating a photoelectric conversion layer 1301, a color filter layer 1302, on-chip lenses 1303, a low-refractive index layer 1304, an adhesive layer 1308, an infrared absorption layer 1305, and a band-pass layer 1309.

The photoelectric conversion layer 1301, the color filter layer 1302, the on-chip lens 1303, and the low-refractive index layer 1304 may have configurations similar to those in the first embodiment. In the photoelectric conversion layer 1301, a plurality of photoelectric conversion devices 1306 are formed. The color filter layer 1302 includes a red color filter 1307R, a green color filter 1307G, and a blue color filter 1307B (hereinafter, collectively referred to as the color filter 1307) corresponding to the respective photoelectric conversion devices 1306.

The adhesive layer 1308 is laminated on the low-refractive index layer 1304, and adheres the infrared absorption layer 1305 to the low-refractive index layer 1304. The adhesive layer 1308 may be formed of an arbitrary material having adhesiveness, e.g., synthetic resin, and preferably has high optical transparency. Further, the adhesive layer 1308 may further have infrared absorption capacity. In this case, the adhesive layer 1308 may contain the above-mentioned infrared absorption material (infrared absorption material described in the description of the infrared absorption layer 105).

The band-pass layer 1309 has a configuration similar to that in the fifth embodiment, and is laminated on the infrared absorption layer 1305. Also with such a configuration, it is possible to remove the infrared component in incident light by the infrared absorption layer 1305 and the band-pass layer 1309. Further, the band-pass layer 1309 is capable of removing a part or all of violet light, and light having a shorter wavelength than the violet light.

The infrared absorption layer 1305 and the band-pass layer 1309 may be laminated on a supporting substrate (not shown) in the process of manufacturing the image pickup device 1300. Specifically, the band-pass layer 1309 may be laminated on the supporting substrate, and the infrared absorption layer 1305 may be laminated thereon.

The laminated body in which the band-pass layer 1309 and the infrared absorption layer 1305 are laminated on the supporting substrate may be adhered to the lower layer structure (from the photoelectric conversion device 1301 to the low-refractive index layer 1304) by the adhesive layer 1308. By removing the supporting substrate after the adhesion, it is possible to prepare the image pickup device 1300.

In this embodiment, by removing the supporting substrate that has supported the band-pass layer 1309 and the infrared absorption layer 1305, it is possible to prepare the lower layer structure of the image pickup device 1300, and the band-pass layer 1309 and the infrared absorption layer 1305 by different manufacturing processes (manufacturing apparatuses), even with a structure having no supporting substrate.

Sixteenth Embodiment

An image pickup device according to a sixteenth embodiment of the present technology will be described. The image pickup device according to this embodiment can be mounted on an imaging apparatus (camera or the like) together with an imaging optical system that forms an image of an object on the image pickup device.

[Structure of Image Pickup Device]

Figure 24:
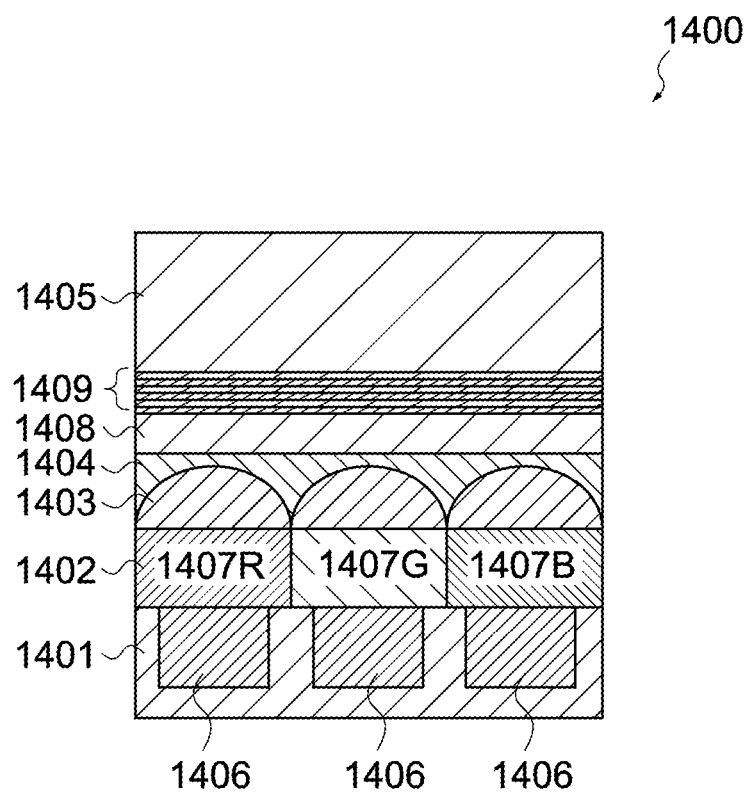
FIG. 24 is a schematic diagram of an image pickup device according to a sixteenth embodiment of the present technology.

FIG. 24 is a schematic diagram showing an image pickup device 1400 according to this embodiment. As shown in the figure, the image pickup device 1400 is configured by laminating a photoelectric conversion layer 1401, a color filter layer 1402, on-chip lenses 1403, a low-refractive index layer 1404, an adhesive layer 1408, a band-pass layer 1409, and an infrared absorption layer 1405.

The photoelectric conversion layer 1401, the color filter layer 1402, the on-chip lenses 1403, and the low-refractive index layer 1404 have configurations similar to those in the first embodiment. In the photoelectric conversion layer 1401, a plurality of photoelectric conversion devices 1406 are formed. The color filter layer 1402 includes a red color filter 1407R, a green color filter 1407G, and a blue color filter 1407B (hereinafter, collectively referred to as the color filter 1407) corresponding to the respective photoelectric conversion devices 1406.

The adhesive layer 1408 is laminated on the low-refractive index layer 1404, and adheres the band-pass layer 1409 to the low-refractive index layer 1404. The adhesive layer 1408 may be formed of an arbitrary material having adhesiveness, e.g., synthetic resin, and preferably has high optical transparency. Further, the adhesive layer 1408 may further have infrared absorption capacity. In this case, the adhesive layer 1408 may contain the above-mentioned infrared absorption material (infrared absorption material described in the description of the infrared absorption layer 105).

The band-pass layer 1409 has a configuration similar to that in the fifth embodiment, and is laminated on the adhesive layer 1408. Also with such a configuration, it is possible to remove the infrared component in incident light by the infrared absorption layer 1405 and the band-pass layer 1409. Further, the band-pass layer 1409 is capable of removing a part or all of violet light, and light having a shorter wavelength than the violet light.

The band-pass layer 1409 and the infrared absorption layer 1405 may be laminated on a supporting substrate (not shown) in the process of manufacturing the image pickup device 1400. Specifically, the infrared absorption layer 1405 may be laminated on the supporting substrate, and the band-pass layer 1409 may be laminated thereon.

The laminated body in which the infrared absorption layer 1405 and the band-pass layer 1409 are laminated on the supporting substrate may be adhered to the lower layer structure (from the photoelectric conversion device 1401 to the low-refractive index layer 1404) by the adhesive layer 1408. By removing the supporting substrate after the adhesion, it is possible to prepare the image pickup device 1400.

In this embodiment, by removing the supporting substrate that has supported the infrared absorption layer 1405 and the band-pass layer 1409, it is possible to prepare the lower layer structure of the image pickup device 1400, and the infrared absorption layer 1405 and the band-pass layer 1409 by different manufacturing processes (manufacturing apparatuses), even with a structure having no supporting substrate.

The present technology is not limited to the above-mentioned embodiments, and various modifications can be made without departing from the essence of the present technology.

For example, in the image pickup device according to each of the embodiments described above, the antireflection layer described in the second embodiment may be laminated as the uppermost layer. Further, in the case where the band-pass layer is laminated on the infrared absorption layer, the protective layer described in the third embodiment may be provided between the infrared absorption layer and the band-pass layer. Further, as described in the first embodiment, the color filter layer does not necessarily need to be provided in the image pickup device according to each embodiment.

EXAMPLE

The heat resistance of the infrared absorption layer in each of the embodiments described above was examined.

Example 1

A cyanine-based infrared absorption dye represented by the following [Chem. 1] and a polycarbonate resin solution (solvent:cyclopentanone) were mixed at the ratio shown in the following [Table 1] to prepare an ink for forming an infrared absorption layer. This ink was applied to a quartz substrate at 2000 rpm for 40 sec by using a spin coater, and dried (solvent removal) at 90° C. for 5 minutes to obtain a sample of an infrared absorption layer.

[Chem. 1]

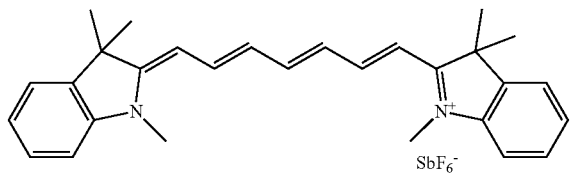

TABLE 1

| Dye (mg) | Polycarbonate (g) | Cyclopentanone (g) |
|---|---|---|
| 2.6 | 0.060 | 3.0 |
| 6.1 | 0.060 | 3.0 |
| 12 | 0.060 | 3.0 |
| 17 | 0.060 | 3.0 |
| 29 | 0.060 | 3.0 |
| 40 | 0.040 | 2.0 |
| 60 | 0.020 | 3.0 |

Figure 25:
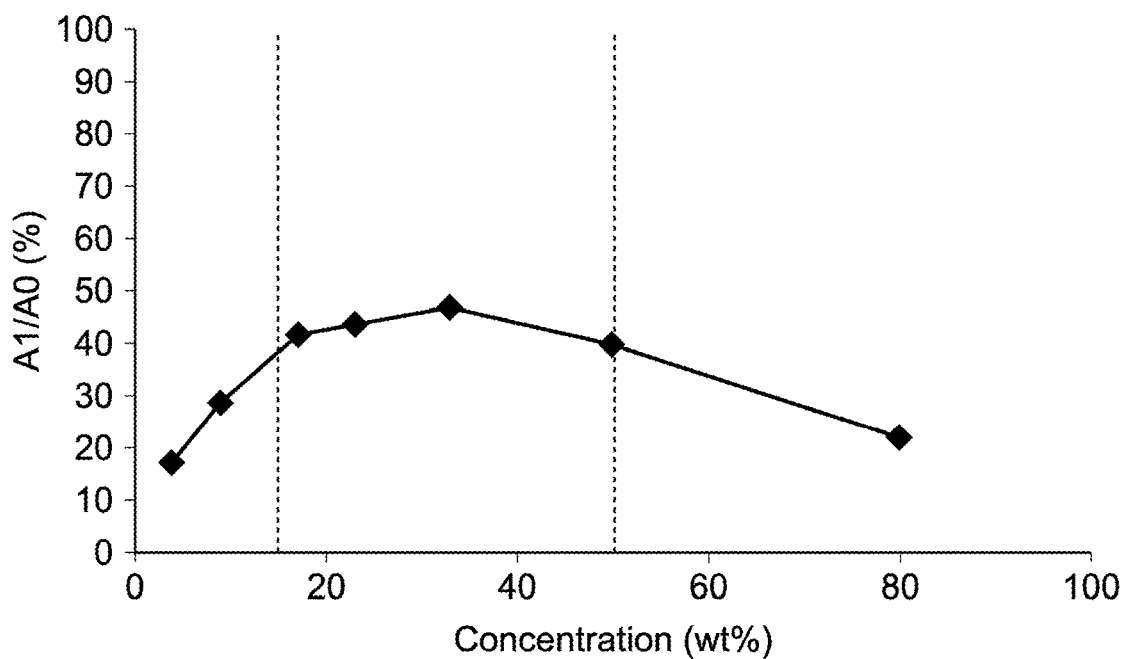
FIG. 25 is a graph showing the residual ratio of an infrared absorption dye according to an example 1 of the present technology.

The absorbance of the infrared region before and after heating the sample in a thermostatic bath for 20 hours was evaluated, and the residual rate (%) of the dye was calculated. FIG. 25 is a graph showing the residual rate of the dye. Note that A0 represents the absorbance before heating and A1 represents the absorbance after heating.

Example 2

A cyanine-based infrared absorption dye represented by the above-mentioned [Chem. 1] and a polyether sulfone resin solution (solvent:cyclopentanone) were mixed at the ratio shown in the following [Table 2] to prepare an ink for forming an infrared absorption layer. This ink was applied to a quartz substrate under the conditions described in Table 2 by using a spin coater, and dried (solvent removal) at 75° C. for 5 minutes to obtain a sample of an infrared absorption layer.

TABLE 2

| Dye (mg) | Polyether sulfone (mg) | Cyclopentanone (mg) | Applying conditions |
|---|---|---|---|
| 4 | 96 | 500 | 1000 rpm for 40 sec, 2000 rpm for 3 sec |
| 14 | 96 | 500 | 1000 rpm for 40 sec, 2000 rpm for 3 sec |
| 32 | 96 | 500 | 2000 rpm for 40 sec, 3000 rpm for 3 sec |
| 51.7 | 96 | 500 | 3000 rpm for 3 sec |
| 96 | 96 | 500 | 4000 rpm for 3 sec |
| 288 | 96 | 500 | 4000 rpm for 3 sec |

Figure 26:
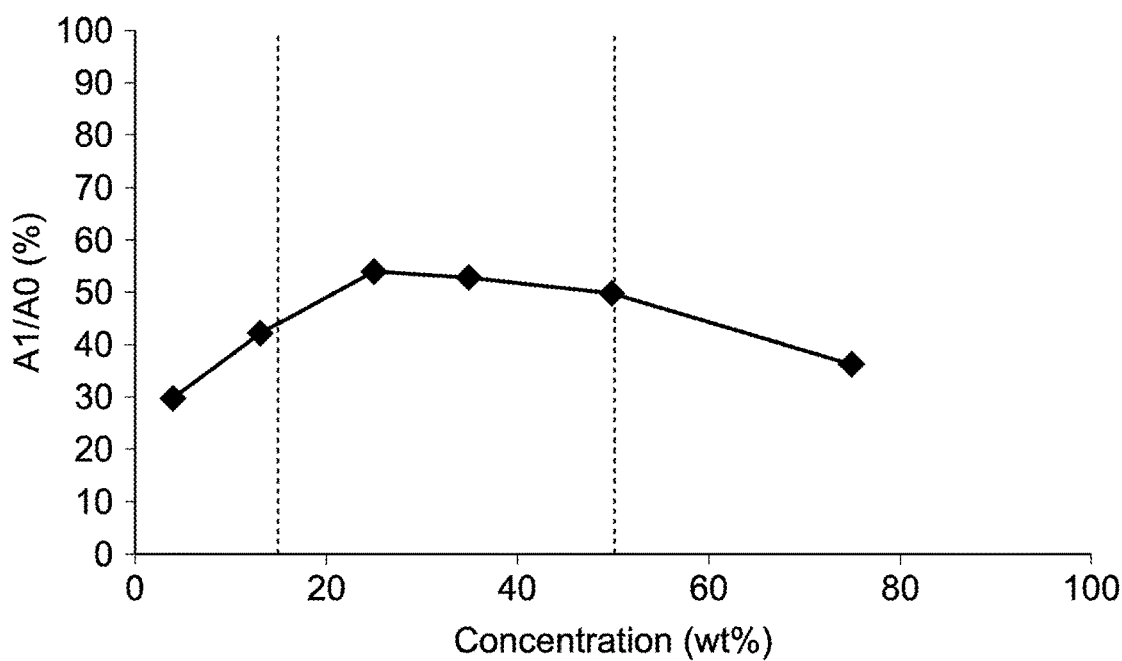
FIG. 26 is a graph showing the residual ratio of an infrared absorption dye according to an example 2 of the present technology.

The absorbance of the infrared region before and after heating the sample in a thermostatic bath for 40 hours was evaluated, and the residual rate (%) of the infrared absorption dye was calculated. FIG. 26 is a graph showing the residual rate of the infrared absorption dye. Note that A0 represents the absorbance before heating and A1 represents the absorbance after heating.

As shown in FIG. 25 and FIG. 26, in the case where the concentration of the infrared absorption layer was not less than 15 wt % and not more than 50 wt % (within broken lines in the figure) with respect to the total amount of the infrared absorption dye and the binder resin, a result of a high residual rate of the infrared absorption dye was obtained. Therefore, it can be said that by setting the concentration of the infrared absorption dye to the above-mentioned range, it is possible to prevent the infrared absorption dye from being deteriorated due to heat, and improve the durability of the image pickup device.

It should be noted that the present technology may take the following configurations.

(1)

An image pickup device, including:

an on-chip lens formed of a high-refractive index material;

a low-refractive index layer formed to be flat on the on-chip lens, the low-refractive index layer being formed of a low-refractive index material; and an infrared absorption layer formed of an infrared absorption material including at least one kind of organic infrared absorption dye and binder resin, a glass transition temperature of the binder resin being not less than 100° C., a concentration of the infrared absorption dye in the infrared absorption material being not less than 15 wt % and not more than 50 wt %, the infrared absorption layer being laminated above the low-refractive index layer.

(2)

The image pickup device according to (1) above, in which a heat yellowing temperature of the infrared absorption material is not less than 180° C.

(3)

The image pickup device according to (1) or (2) above, in which a maximum absorption wavelength of the infrared absorption dye is not less than 600 nm and not more than 1200 nm, and a molar absorption coefficient of the infrared absorption dye is not less than 1000 L/mol·cm.

(4)

The image pickup device according to any one of (1) to (3) above, in which the infrared absorption dye has an anion moiety that is larger in size or formula weight than a perchlorate ion or less easily oxidized, or a cation moiety that is larger in size or formula weight than an ammonium ion or less easily oxidized.

(5)

The image pickup device according to any one of (1) to (4) above, further including a protective layer laminated on the infrared absorption layer, the protective layer blocking oxygen and water or suppressing physical damage.

(6)

The image pickup device according to any one of (1) to (5) above, further including a band-pass layer laminated above the low-refractive index layer, the band-pass layer being formed of a multilayer film of a high-refractive index material and a low-refractive index material.

(7)

The image pickup device according to any one of (1) to (6) above, further including an antireflection layer laminated as an uppermost layer, the antireflection layer preventing light that enters the antireflection layer from an upper layer side and a lower layer side from being reflected.

(8)

The image pickup device according to any one of (1) to (7) above, further including a color filter layer laminated below the on-chip lens.

(9)

The image pickup device according to any one of (1) to (8) above, in which the color filter layer has infrared absorption capacity.

(10)

The image pickup device according to any one of (1) to (9) above, further including a supporting substrate that supports the infrared absorption layer.

(11)

The image pickup device according to any one of (1) to (10) above, further including an adhesive layer laminated on the low-refractive index layer, the adhesive layer being formed of an adhesive material.

REFERENCE SIGNS LIST 100, 200, 300, 400, 500, 600, 700, 800, 900, 1000, 1100, 1200, 1300, 1400, 1500, 1600 image pickup device 101, 201, 301, 401, 501, 601, 701, 801, 901, 1001, 1101, 1201, 1301, 1401, 1501, 1601 photoelectric conversion layer 102, 202, 302, 402, 502, 602, 702, 802, 902, 1002, 1102, 1202, 1302, 1402, 1502, 1602 color filter layer 103, 203, 303, 403, 503, 603, 703, 803, 903, 1003, 1103, 1203, 1303, 1403, 1503, 1603 on-chip lens 104, 204, 304, 404, 504, 604, 704, 804, 904, 1004, 1104, 1204, 1304, 1404, 1504, 1604 low-refractive index layer 105, 205, 305, 405, 505, 605, 705, 805, 905, 1005, 1105, 1205, 1305, 1405, 1505, 1605 infrared absorption layer 106, 206, 306, 406, 506, 606, 706, 806, 906, 1006, 1106, 1206, 1306, 1406, 1506, 1606 photoelectric conversion device 107, 207, 307, 407, 507, 607, 707, 807, 907, 1007, 1107, 1207, 1307, 1407, 1507, 1607 color filter 208, 1609 antireflection layer 308, 1508, 1608 protective layer 408, 808, 908, 1008, 1108, 1208, 1308, 1408 adhesive layer 309, 410, 608, 708, 909, 1009, 1109, 1309, 1409 band-pass layer 409, 809, 910, 1010 supporting substrate

The invention claimed is:

1. An image pickup device, comprising:
a photoelectric conversion layer;
a color filter layer on the photoelectric conversion layer;
an on-chip lens on the color filter layer, wherein the on-chip lens comprises a first material, wherein the first material has a first refractive index;
an index layer on a light incident side of the on-chip lens, wherein the index layer comprises a second material, the second material has a second refractive index, and the first refractive index of the first material of the on-chip lens is greater than the second refractive index of the second material of the index layer;
an infrared absorption layer that comprises an infrared absorption material including an organic infrared absorption dye and a binder resin, wherein the organic infrared absorption dye comprises an anion moiety that is larger in one of size or formula weight than a perchlorate ion, a glass transition temperature of the binder resin is one of greater than or equal to 100° C., a concentration of the organic infrared absorption dye in the infrared absorption material is: one of greater than or equal to 15 wt %, and one of less than or equal to 50 wt %, and the infrared absorption layer is on a light incident side of the index layer;
a protective layer on a light incident side of the infrared absorption layer, wherein a portion of the protective layer extends in a lamination direction of the image pickup device to a side surface of the infrared absorption layer, a side surface of the color filter layer, and a side surface of the index layer at an outer peripheral portion of the image pickup device, without covering the photoelectric conversion layer; and
an antireflection layer on a light incident side of the protective layer, wherein the antireflection layer covers an entire top surface of the protective layer.

2. The image pickup device according to claim 1, wherein a heat yellowing temperature of the infrared absorption material is one of greater than or equal to 180° C.

3. The image pickup device according to claim 1, wherein
a maximum absorption wavelength of the organic infrared absorption dye is one of greater than or equal to 600 nm and one of less than or equal to 1200 nm, and
a molar absorption coefficient of the organic infrared absorption dye is one of greater than or equal to 1000 L/mol·cm.

4. The image pickup device according to claim 1, wherein the organic infrared absorption dye further comprises
a cation moiety that is larger in one of size or formula weight than an ammonium ion.

5. The image pickup device according to claim 1, further comprising a band-pass layer laminated above the index layer, the band-pass layer being formed of a multilayer film of a high-refractive index material and a low-refractive index material.

6. The image pickup device according to claim 1,
wherein the antireflection layer prevents reflection of light that enters the antireflection layer.

7. The image pickup device according to claim 1, wherein the color filter layer is between the photoelectric conversion layer and the on-chip lens.

8. The image pickup device according to claim 7, wherein the color filter layer has infrared absorption capacity.

9. The image pickup device according to claim 1, further comprising a supporting substrate that supports the infrared absorption layer.

10. The image pickup device according to claim 1, further comprising an adhesive layer laminated on the index layer, the adhesive layer being formed of an adhesive material.

11. The image pickup device according to claim 1, wherein a ratio of a molar absorption coefficient of a maximum absorption wavelength in an infrared region of the organic infrared absorption dye and the molar absorption coefficient of the maximum absorption wavelength in a visible region of the organic infrared absorption dye is less than 0.1.

12. The image pickup device according to claim 1, wherein
the organic infrared absorption dye comprises a plurality of types of organic infrared absorption dyes, and
a respective organic infrared absorption dye of the plurality of types of organic infrared absorption dyes is between 15 wt % and 50 wt % with respect to a total amount of the plurality of types of organic infrared absorption dyes.

* * * * *